(12) United States Patent
Miki

(10) Patent No.: US 10,644,094 B2
(45) Date of Patent: May 5, 2020

(54) DISPLAY DEVICE

(71) Applicant: Japan Display Inc., Minato-ku (JP)

(72) Inventor: Hirohisa Miki, Tokyo (JP)

(73) Assignee: Japan Display Inc., Minato-ku (JP)

( * ) Notice: Subject to any disclaimer, the term of this patent is extended or adjusted under 35 U.S.C. 154(b) by 57 days.

(21) Appl. No.: 16/132,826

(22) Filed: Sep. 17, 2018

(65) Prior Publication Data

US 2019/0096980 A1    Mar. 28, 2019

(30) Foreign Application Priority Data

Sep. 28, 2017    (JP) .................................. 2017-188337

(51) Int. Cl.
| | |
|---|---|
| *G09G 3/30* | (2006.01) |
| *G09G 3/36* | (2006.01) |
| *H01L 27/32* | (2006.01) |
| *H01L 51/00* | (2006.01) |
| *G09G 3/3266* | (2016.01) |
| *H01L 27/12* | (2006.01) |
| *H01L 51/52* | (2006.01) |

(52) U.S. Cl.
CPC ....... *H01L 27/3276* (2013.01); *G09G 3/3266* (2013.01); *H01L 27/124* (2013.01); *H01L 27/1218* (2013.01); *H01L 27/1244* (2013.01); *H01L 27/1248* (2013.01); *H01L 51/0097* (2013.01); *G09G 2300/0426* (2013.01); *G09G 2300/0439* (2013.01); *H01L 51/5253* (2013.01); *H01L 2251/5338* (2013.01)

(58) Field of Classification Search
CPC .............. G09G 2310/0281; G09G 3/30–3291
See application file for complete search history.

(56) References Cited

U.S. PATENT DOCUMENTS

| | | | |
|---|---|---|---|
| 9,472,507 B2 | 10/2016 | Kwak | |
| 2010/0073616 A1* | 3/2010 | Abe ................... | G02F 1/136227 349/138 |
| 2014/0367658 A1 | 12/2014 | Kwak | |

(Continued)

FOREIGN PATENT DOCUMENTS

JP    2015-2177    1/2015

*Primary Examiner* — Sanghyuk Park
(74) *Attorney, Agent, or Firm* — Oblon, McClelland, Maier & Neustadt, L.L.P.

(57) ABSTRACT

A display device includes a display region, a peripheral region around the display region, a substrate having flexibility, a terminal group in the peripheral region, a plurality of connection wirings connected to the terminal group, extending from the terminal group in a first direction and arranged in a second direction intersecting the first direction, an inorganic insulating film in the peripheral region, and an organic insulating film in the peripheral region. The peripheral region has a peripheral region (first peripheral region) curved in a thickness direction of the substrate. The first peripheral region includes a region (first region) that overlaps each of the plurality of connection wirings and a region (second region) that does not overlap the plurality of connection wirings. The first region and the second region are arranged in the second direction. The inorganic insulating film and the organic insulating film are present in the first region, and the inorganic insulating film is not present and the organic insulating film is present in the second region.

20 Claims, 13 Drawing Sheets

(56) References Cited

U.S. PATENT DOCUMENTS

2015/0131017 A1\* 5/2015 Ro .................... G02F 1/133345
349/42
2018/0004016 A1\* 1/2018 Tada .................... G02F 1/0009

\* cited by examiner

DISPLAY DEVICE

CROSS-REFERENCE TO RELATED APPLICATION

The present application claims priority from Japanese Patent Application No. 2017-188337 filed on Sep. 28, 2017, the content of which is hereby incorporated by reference into this application.

TECHNICAL FIELD OF THE INVENTION

The present invention relates to a display device, for example, to a technique effectively applied to a display device having a plurality of wirings provided in a curved portion of a flexible substrate.

BACKGROUND OF THE INVENTION

A technique of using a substrate having flexibility for a substrate constituting a display device has been known (see Japanese Patent Application Laid-Open Publication No. 2015-2177 (Patent Document 1)).

SUMMARY OF THE INVENTION

A circuit formed on a substrate of a display device is electrically connected to an external circuit through a plurality of connection wirings formed on a substrate. When the plurality of connection wirings are provided in a curved region of the substrate, a crack may occur in an inorganic insulating film serving as a base of the connection wiring due to the stress that is generated by bending the substrate. In addition, when the substrate is exposed by removing the inorganic insulating film and an organic insulating film covering the inorganic insulating film in a region between the adjacent connection wirings, a protection capability of the connection wiring may decrease.

An object of the present invention is to provide a technique to improve the performance of the display device.

A display device which is one aspect of the present invention comprises: a display region; a peripheral region around the display region; a substrate having flexibility; a terminal group in the peripheral region; a plurality of connection wirings connected to the terminal group, extending from the terminal group in a first direction and arranged in a second direction intersecting the first direction; an inorganic insulating film in the peripheral region; and an organic insulating film in the peripheral region. The peripheral region has a first peripheral region curved in a thickness direction of the substrate. The first peripheral region includes a first region that overlaps the plurality of connection wirings and a second region that does not overlap the plurality of connection wirings. The first region and the second region are arranged in the second direction. The inorganic insulating film and the organic insulating film are present in the first region, and the inorganic insulating film is not present and the organic insulating film is present in the second region.

BRIEF DESCRIPTIONS OF THE DRAWINGS

DESCRIPTIONS OF THE PREFERRED EMBODIMENTS

Figure 1:
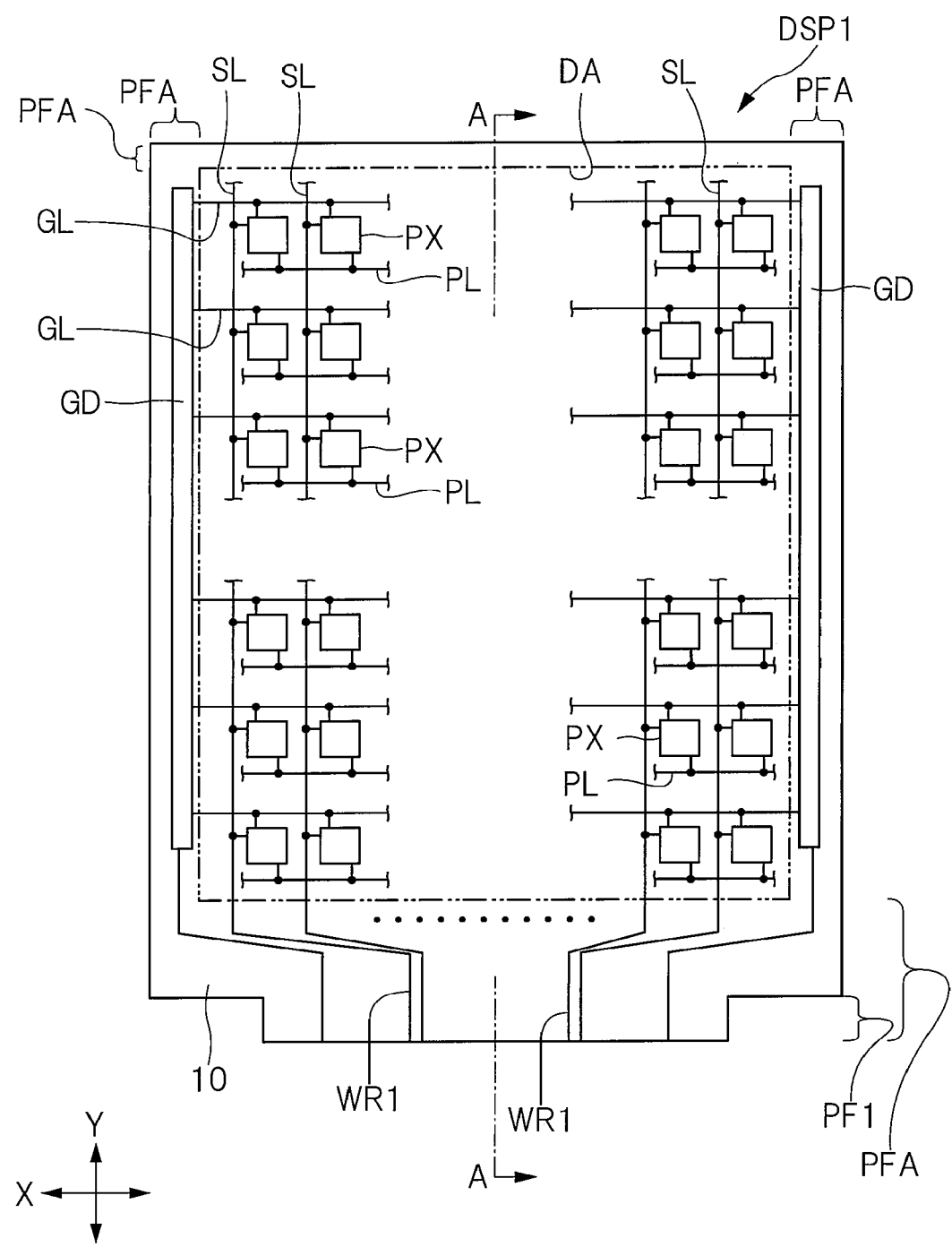
FIG. 1 is a plan view showing an example of a display device of an embodiment.

Hereinafter, each embodiment of the present invention will be described with reference to the drawings. Note that the disclosure is mere an example, and it is a matter of course that any alteration that is easily conceivable by a person skilled in the art while keeping a gist of the invention is included in the range of the present invention. In addition, a width, a thickness, a shape, and the like of each portion of the drawings are schematically illustrated in some cases as compared to actual modes in order to make the description clearer, but these are shown just by way of example, and do not limit the interpretation of the present invention. In addition, in the present specification and the respective drawings, the same or relevant reference characters are applied to the elements similar to that described in relation to the foregoing drawings, and detailed descriptions thereof will be omitted as appropriate in some cases.

Also, in the following description of the embodiments, an organic EL (electroluminescence) display device provided with an organic light-emitting element in an electro-optic layer for forming a display image is taken as an example of the display device. In the organic EL display device, the display image is formed by electrically controlling the light-emitting element referred to as an OLED (organic light-emitting diode). However, the technique described below is applicable to various kinds of modification other than the organic EL display device. For example, the electro-optical layer described above may be a layer including an element whose optical characteristics are changed by applying electrical energy such as a liquid crystal layer, an inorganic light-emitting element layer, a MEMS (Micro Electro Mechanical Systems) shutter, or an electrophoretic element layer, other than the organic light-emitting element.

<Configuration of Display Device>

Figure 2:
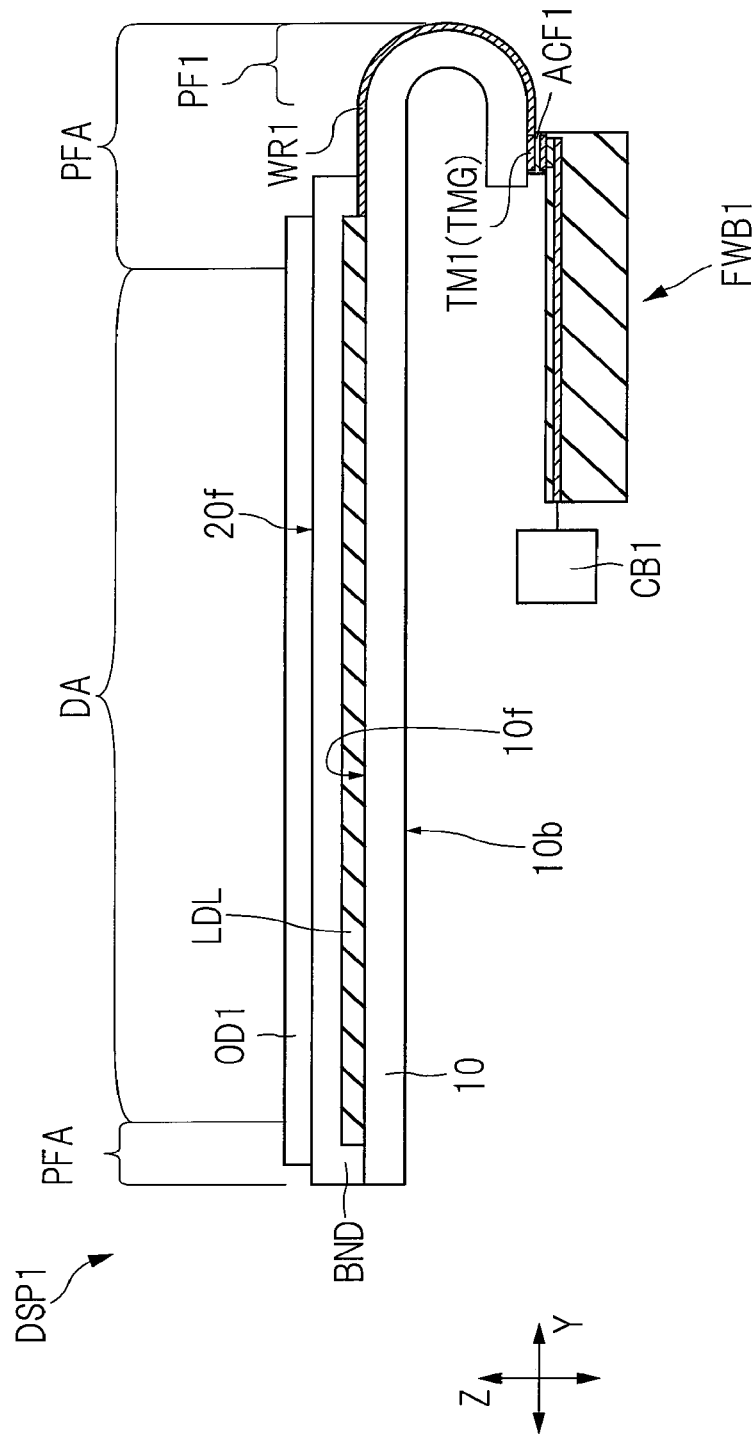
FIG. 2 is a cross-sectional view taken along a line A-A of FIG. 1.
Figure 3:
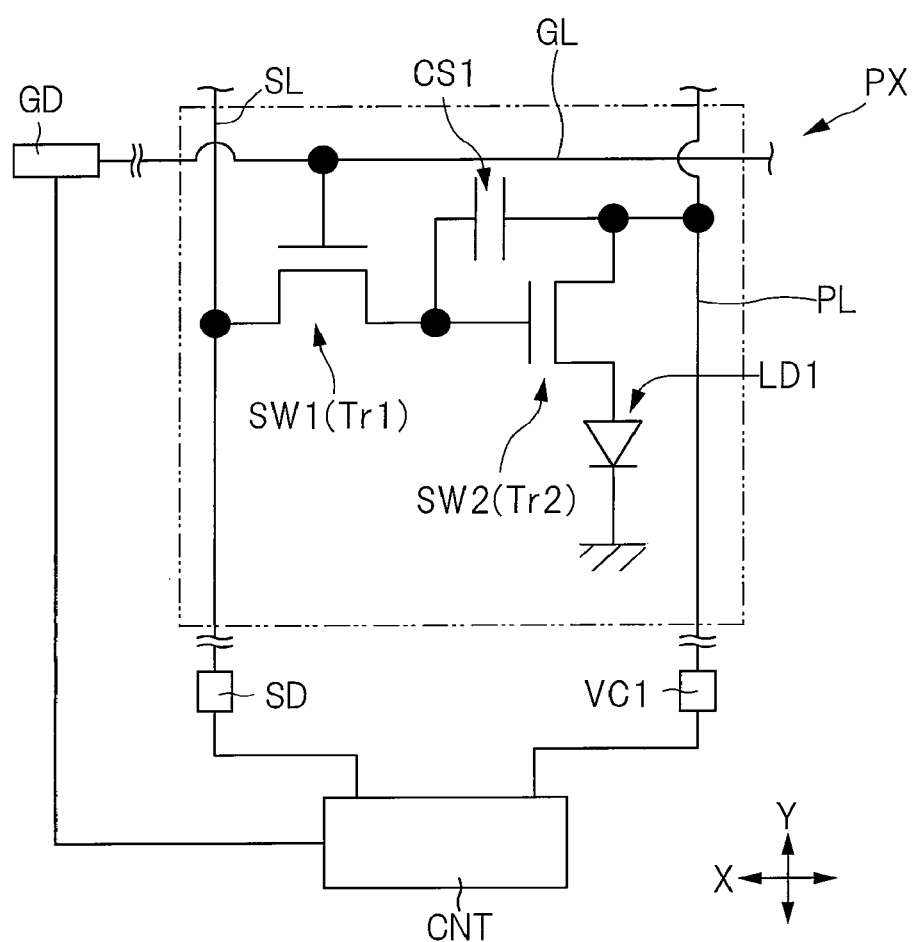
FIG. 3 is a circuit diagram showing an example of a circuit configuration around one pixel in the display device shown in FIG. 1.
Figure 4:
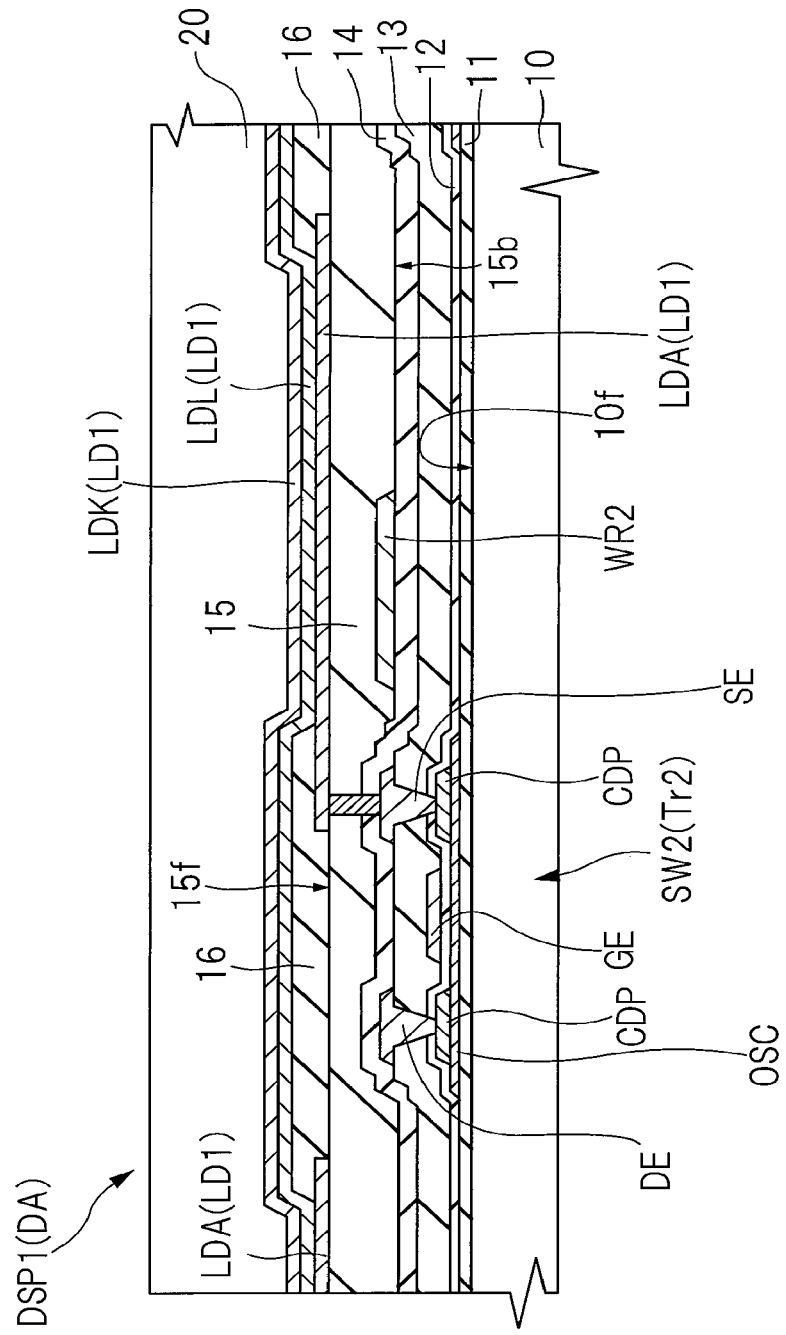
FIG. 4 is an enlarged cross-sectional view of a part of a display region of FIG. 1.

First, a configuration of a display device will be described. FIG. 1 is a plan view showing an example of the display device of the present embodiment. In FIG. 1, a boundary between a display region DA and a peripheral region PFA in a plan view is indicated by a two-dot chain line. Also, a part of the circuit block and the wiring of the circuit provided in a display device DSP1 are schematically indicated by solid lines. FIG. 2 is a cross-sectional view taken along a line A-A of FIG. 1. Although FIG. 2 is a cross-sectional view, hatching is omitted except for an organic light-emitting layer LDL, a connection wiring WR1, a terminal TM1, and a wiring board FWB1 for ease of viewing. Also, FIG. 3 is a circuit diagram showing an example of circuit configuration around one pixel in the display device shown in FIG. 1. In addition, FIG. 4 is an enlarged cross-sectional view of a part of the display region of FIG. 1.

As shown in FIG. 1, the display device DSP1 of the present embodiment has the display region DA in which an image is formed in response to an input signal supplied from outside. Also, the display device DSP1 has the peripheral region (non-display region, frame region) PFA provided so as to surround the periphery of the display region DA in plan view. Note that the display region DA of the display device DSP1 shown in FIG. 1 is a quadrangle, but the display region DA may have any shape other than the quadrangle such as a polygon and a circle. The display region DA is an active region where the display device DSP1 displays an image in plan view showing a display surface.

In the display region DA, a plurality of pixels PX are arranged. The plurality of pixels PX are arranged in a matrix in an X direction and a Y direction intersecting the X-direction. The display region DA includes plurality of scanning lines (gate lines) GL extending in the X direction and a plurality of video signal lines (source lines) SL extending in the Y direction. In the example shown in FIG. 1, the plurality of scanning lines GL are arranged in the Y direction, and the plurality of video signal lines SL are arranged in the X direction. In addition, power supply lines PL that supply power supply potential to the pixels PX are disposed in the display region DA. Note that there are various kinds of modification in the number and the layout of the scanning lines GL, video signal lines SL and power supply lines PL other than the example shown in FIG. 1. For example, the power supply line PL supplies common electric potential to each of the plurality of pixels PX of display region DA. Therefore, the power supply line PL may be wider than the scanning line GL and the video signal line SL, and may be configured to overlap the plurality of pixels PX.

Circuits such as a gate driving circuit (scanning line driving circuit) GD and the like are disposed in the peripheral region PFA around the display region DA. In some cases, the display device DSP1 is provided with a plurality of circuits such as a gate buffer circuit and a switching circuit other than the gate driving circuit GD. In FIG. 1, the gate driving circuit GD is shown as a typical example. The gate driving circuit GD is connected to each of the plurality of scanning lines GL, and transmits a scanning signal to the scanning line GL. In the example shown in FIG. 1, the gate driving circuit GD is disposed on both sides of the display region DA in the X direction. Also, a plurality of connection wirings WR1 and the like connected to the circuit in the display region DA are disposed in the peripheral region PFA of the display device DSP1. The connection wiring WR1 includes a connection wiring connected to the gate driving circuit GD, a connection wiring connected to the video signal line SL and a connection wiring connected to the power supply line PL.

The display device DSP1 has a substrate 10. The substrate is a substrate having flexibility (flexible substrate). As shown in FIG. 2, the substrate 10 has a curved portion. In other words, the peripheral region PFA includes a curved peripheral region (first peripheral region) PF1. For example, the substrate is made of a resin material (organic material) containing polymer such as polyimide, polyamide, polycarbonate or polyester in order to give flexibility to the substrate 10. Also, the substrate 10 has a front surface (main surface, surface) 10$f$ opposed to the organic light-emitting layer LDL and a back surface (main surface, surface) 10$b$ on an opposite side of the front surface 10$f$. The organic light-emitting layer LDL constituting the organic light-emitting element LD1 (see FIG. 4) is disposed on the front surface 10$f$ of the substrate 10. The organic light-emitting layer LDL is covered with an insulating film 20 as a protective film. The organic light-emitting layer LDL is sandwiched between the substrate 10 and the insulating film 20 so as to be protected from contamination from outside. The insulating film 20 may have the single-layered structure or the multilayer structure. For example, the insulating film 20 can have the stacked-layer structure including an inorganic film and an organic film. By way of example, the insulating film 20 can have the stacked-layer structure in which an acrylic film is sandwiched between silicon nitride (SiN) films opposed to each other.

In addition, in the example shown in FIG. 2, the display device DSP1 has an optical element OD1. The optical element OD1 is disposed on a display surface side of the display device DSP1, in other words, on the opposite side of the substrate 10 relative to the organic light-emitting layer LDL. The optical element OD1 includes, for example, a polarizing plate, and may include a retardation plate if necessary. Also, the optical element OD1 may include a color filter. Further, the example in FIG. 2 shows the structure in which the optical element OD1 is stuck on the insulating film 20. However, as modification, the structure in which an opposing substrate (not shown) is disposed at a position opposed to the substrate 10 and the optical element OD1 is stuck on the opposing substrate is also possible.

Also, the connection wiring WR1 is formed on the front surface 10$f$ of the substrate 10. A part of the connection wiring WR1 is disposed in the curved peripheral region PF1 in the peripheral region PFA. In addition, as shown in FIG. 2, a terminal group TMG is provided on the front surface 10$f$ of the substrate 10. Terminals TM1 constructing the terminal group TMG are electrically connected to the wiring board FWB1 through a conductive member such as an anisotropic conductive film ACF1 and the like. Further, the wiring board FWB1 is connected to the circuit board CB1.

Each of the plurality of pixels PX shown in FIG. 1 includes the organic light-emitting element LD1, a transistor Tr1 functioning as a pixel selecting switch SW1 and a transistor Tr2 functioning as a driving switch SW2 which supplies power supply potential to drive the organic light-emitting element LD1 as shown in FIG. 3. In addition, in the example shown in FIG. 4, the pixel PX includes a capacitor element CS1 connected between a drain electrode of the transistor Tr1 and a gate electrode of the transistor Tr2.

The driving circuits for driving the pixels PX include a gate driving circuit GD connected to the scanning line GL, a video signal driving circuit SD connected to the video signal line SL, a power supply circuit VC1 connected to the power supply line PL, and the like.

The gate driving circuit GD selects the scanning line GL in response to the timing signal transmitted from the control circuit unit CNT. A voltage for turning on the gate of the transistor Tr1 (in other words, the pixel selecting switch SW1) connected to the scanning line GL is applied to the selected scanning line GL.

A video signal is input to the video signal driving circuit SD from the control circuit unit CNT. The video signal driving circuit SD outputs a voltage to the video signal line SL based on the video signal. In the pixel PX in which the transistor Tr1 is turned on, the voltage that is input via the video signal line SL is written in the capacitor element CS1 connected to the transistor Tr1. In other words, in the pixel PX in which the transistor Tr1 is turned on, electric charge in accordance with the voltage supplied from the video signal driving circuit SD is accumulated in the capacitor element CS1.

The power supply circuit VC1 is connected to one electrode of the capacitor element CS1 through the power supply line PL. In addition, the power supply circuit VC1 is connected through the power supply line PL to one electrode (for example, a drain electrode) that is not a gate among the electrodes of the transistor Tr2 which is the driving switch SW2. When the transistor Tr1 is turned on, the above-described voltage is written in the capacitor element CS1 and a voltage for turning on the gate of the transistor Tr2 is supplied to the transistor Tr2. When the gate of the transistor Tr2 is turned on, a current in accordance with the voltage written in the capacitor element CS1 flows through the organic light-emitting element LD1 connected to the transistor Tr2.

An anode of the organic light-emitting element LD1 is connected to an electrode (for example, source electrode) of the transistor Tr2 and a cathode of the organic light-emitting element LD1 is grounded (in other words, connected to the ground). When a current flows through the organic light-emitting element LD1, the organic light-emitting element LD1 emits light in accordance with the current value. Therefore, by controlling the voltage supplied to each of the plurality of pixels PX and the timing at which the voltage is supplied, the light emission phenomenon of the organic light-emitting element LD1 can be controlled to form an image.

The gate driving circuit GD shown in FIG. 3 is disposed on the substrate 10 as shown in FIG. 1. In addition, each of the video signal driving circuit SD, the power supply circuit VC1, and the control circuit unit CNT is disposed on either the wiring board FWB1 or the circuit board CB1 shown in FIG. 2. However, there are various kinds of modification in the places where the various circuits shown in FIG. 3 are formed. For example, a driver chip (not shown) may be mounted on the substrate 10 such that some or all of the video signal driving circuit SD, the power supply circuit VC1, and the control circuit unit CNT are disposed in this driver chip.

The circuit components constituting the pixel PX shown in FIG. 3 are formed on, for example, the substrate 10 as shown in FIG. 4. The display device DSP1 has an insulating film 11 on the front surface 10$f$ of the substrate 10 in the display area DA. The insulating film 11 is a base layer of various circuits including a TFT, and is made of, for example, an inorganic insulating material such as silicon nitride (SiN) or silicon oxide (SiO).

Further, the transistor Tr2 which is a TFT is formed on the insulating film 11 which is the base layer. In FIG. 4, the transistor Tr2 is shown by way of example. Hereinafter, a configuration example of the transistor Tr2 will be described. However, the transistor Tr1 shown in FIG. 3 is formed in the same layer as the transistor Tr2 shown in FIG. 4, and has a similar structure. The transistor Tr2 includes a semiconductor region OSC that constitutes a channel region, a source region, and a drain region. The semiconductor region OSC is made of, for example, polysilicon and is formed on the insulating film 11. In each of the source region and the drain region in the semiconductor region OSC, a conductor pattern CDP connected to the source electrode SE or the drain electrode DE of the transistor Tr2 is formed. The conductor pattern CDP is formed by, for example, the sputtering method.

The semiconductor region OSC is covered with an insulating film 12 which is a gate insulating film. The insulating film 12 is made of, for example, silicon oxide, and is deposited over the semiconductor region OSC and the conductor patterns CDP by, for example, the chemical vapor deposition (CVD). Further, a gate electrode GE is formed on the insulating film 12. The gate electrode GE is formed at a position overlapping the channel region of the semiconductor region OSC. In other words, the gate electrode GE is opposed to the channel region of the semiconductor region OSC via the insulating film 12 which is the gate insulating film. The gate electrode GE is formed by patterning a metal film formed by the sputtering method or the like. Although not shown, a plurality of scanning lines GL shown in FIG. 1 are formed in the same layer as the gate electrode GE. Each of the plurality of scanning lines GL is formed to extend in the X direction shown in FIG. 1.

The gate electrode GE and the insulating film 12 are covered with an insulating film 13. The insulating film 13 is made of, for example, silicon nitride, silicon oxide, or a stacked film thereof. The insulating film 13 is formed by, for example, the CVD method. The source electrode SE and the drain electrode DE made of a metal film are disposed on the insulating film 13. Contact holes penetrating the insulating films 12 and 13 in the thickness direction are formed in the insulating film 12 and the insulating film 13, and the source electrode SE is connected to the conductor pattern CDP in the source region via the contact hole. Also, the drain electrode DE is connected to the conductor pattern CDP in the drain region via the contact hole. The source electrode SE and the drain electrode DE are formed by, for example, the sputtering method. Further, a plurality of video signal lines SL shown in FIG. 1 are formed in the same layer as the source electrode SE and the drain electrode DE. Each of the plurality of video signal lines SL is formed to extend in the Y direction shown in FIG. 1.

The source electrode SE, the drain electrode DE, and the insulating film 13 are covered with an insulating film 14. The insulating film 14 is made of, for example, silicon nitride, silicon oxide, or a stacked film thereof. The insulating film 14 is formed by, for example, the CVD method. A wiring WR2 is formed on the insulating film 14. The wiring WR2 is obtained by patterning a metal film formed by the sputtering method or the like. The wiring WR2 can be used as, for example, the power supply line PL shown in FIG. 1. In addition, the wiring WR2 can be used as a part of the scanning line GL and the video signal line SL shown in FIG.

1. By providing the scanning line GL and the video signal line SL in the wiring layer on the insulating film 14, it is possible to make these signal wirings have a multilayer structure. In this case, the degree of freedom of wiring layout is improved.

Further, a flattening film (insulating film) 15 is formed over the insulating film 14. The flattening film 15 is made of an organic material such as acrylic resin. The flattening film 15 has a back surface 15b opposed to the front surface 10f of the substrate 10 and a front surface 15f on an opposite side of the back surface 15b. The front surface 15f is flatter than the back surface 15b. The organic light-emitting element LD1 including an anode (lower electrode) LDA, a cathode (upper electrode) LDK, and the organic light-emitting layer LDL is formed on the front surface 15f of the flattening film 15.

The organic light-emitting element LD1 has the anode LDA, the organic light-emitting layer LDL, and the cathode LDK that are stacked in order from the substrate 10 side. The organic light-emitting layer LDL shown in FIG. 4 is, for example, a stacked film of a plurality of organic material layers including a hole transporting layer, a light-emitting layer, an electron transporting layer, and the like. In addition, the anode LDA, the organic light-emitting layer LDL, and the cathode LDK are covered with the insulating film 20 to be sealed. The insulating film 20 is a protective film for protecting a member disposed between the insulating film 20 and the substrate 10. The display device DSP1 is a top emission type organic EL display device in which the light generated in the organic light-emitting layer LDL is taken out from the opposite side of the substrate 10, in other words, from the insulating film 20 side.

The anode LDA is electrically connected to the source electrode SE of the transistor Tr2 via a contactor (conductor pillar) formed so as to penetrate the flattening film 15 and the insulating film 14 in the thickness direction. The anode LDA is made of, for example, a transparent electrode material such as indium tin oxide (ITO). The ITO film can be formed by the reactive sputtering method using an Ar+$O^2$ mixed gas. It is also possible to form the anode LDA from another transparent electrode material such as indium zinc oxide (IZO), tin oxide, zinc oxide, indium oxide, or aluminum composite oxide. Note that the display device DSP1 is a top emission type display device. In this case, a reflective layer made of a material such as aluminum or silver having a reflectance higher than that of the transparent electrode material may be provided in the lower layer of the anode LDA which is the lower electrode.

In addition, the anode LDA is formed such that each of the plurality of pixels PX shown in FIG. 1 can operate independently. Therefore, the anode LDA separated from the adjacent anode LDA is formed in each of the plurality of pixels PX. A bank member 16 is formed between the adjacent anodes LDA on the front surface 15f of the flattening film 15. The bank member 16 is a member that partitions the effective region of the pixel PX (see FIG. 3), and is made of, for example, a light-shielding inorganic material.

Further, the ground potential is supplied to the cathode LDK. The ground potential is supplied by, for example, a reference potential line (not shown) formed in the same layer as the wiring WR2 in FIG. 4. Each of the plurality of pixels PX shown in FIG. 1 has the cathode LDK, and a common potential is supplied to each cathode LDK. Therefore, the cathode LDK is formed so as to overlap the plurality of pixels PX. The cathode LDK is formed of a transparent electrode material such as ITO or IZO like the anode LDA.

<Wiring Structure of Peripheral Region>

Figure 5:
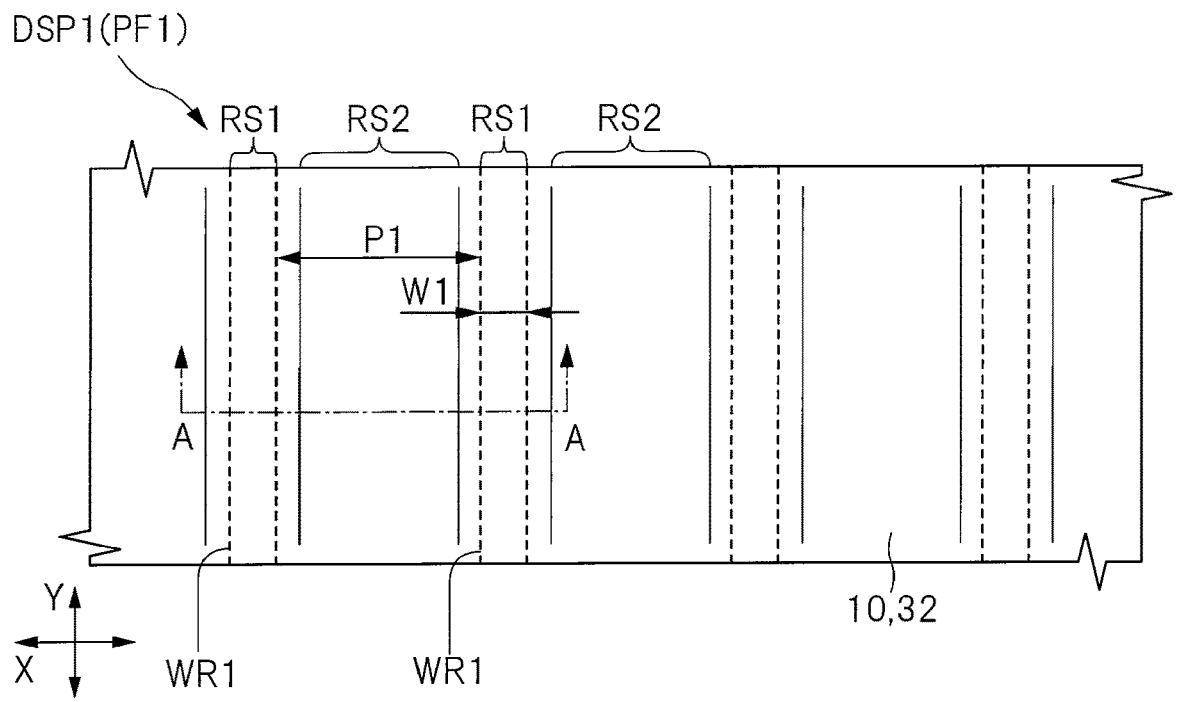
FIG. 5 is an enlarged plan view of a curved portion in a peripheral region shown in FIG. 1.
Figure 6:
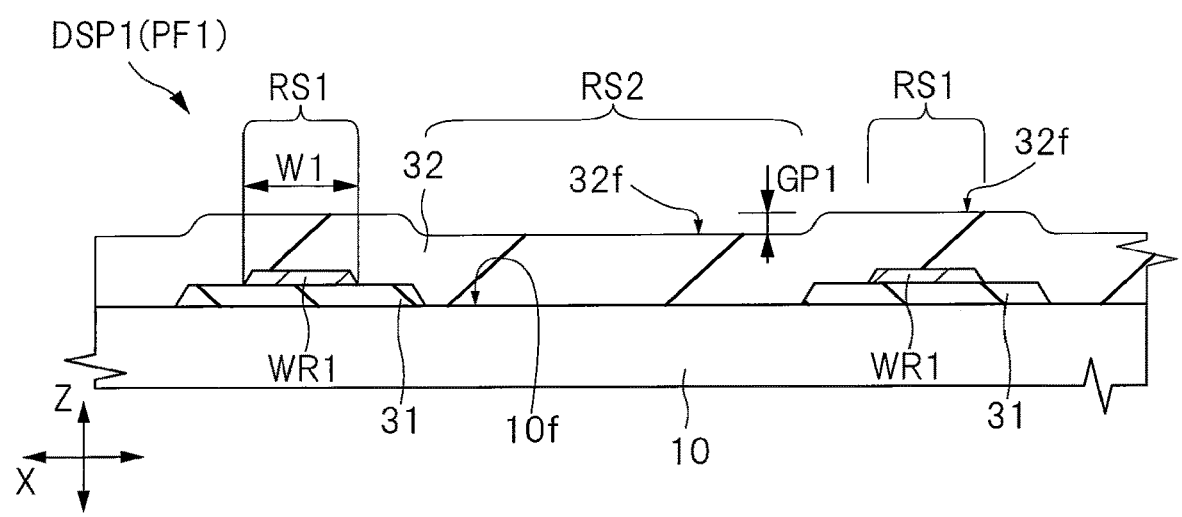
FIG. 6 is an enlarged cross-sectional view taken along a line A-A of FIG. 5.
Figure 7:
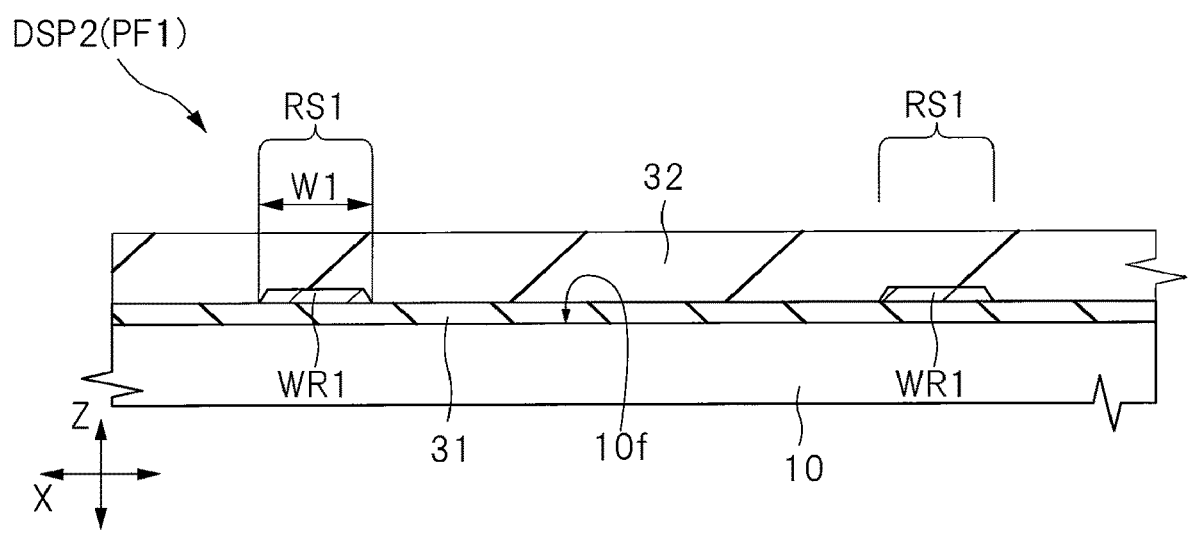
FIG. 7 is an enlarged cross-sectional view showing an examination example with respect to FIG. 6.
Figure 8:
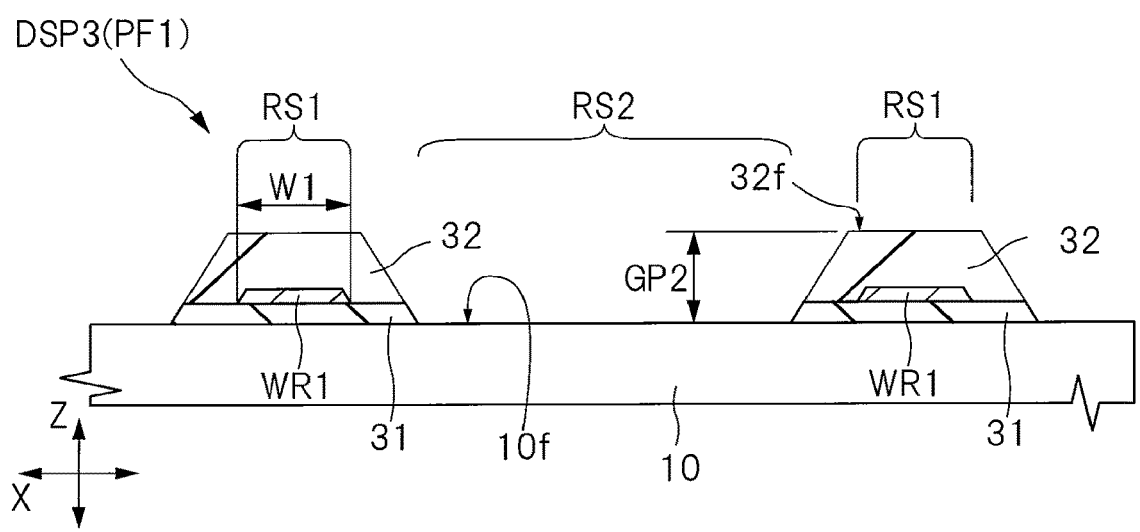
FIG. 8 is an enlarged cross-sectional view showing another examination example with respect to FIG. 6.

Next, the structure of the connection wiring formed in the curved portion of the peripheral region PFA shown in FIG. 1 will be described. FIG. 5 is an enlarged plan view of the curved portion in the peripheral region shown in FIG. 1. FIG. 6 is an enlarged cross-sectional view taken along a line A-A of FIG. 5. In FIG. 5, an outline of the connection wiring WR1 covered with an organic insulating film 32 shown in FIG. 6 is indicated by a dotted line. In addition, each of FIG. 7 and FIG. 8 is an enlarged cross-sectional view showing an examination example with respect to FIG. 6.

As shown in FIG. 5, each of the plurality of connection wirings WR1 extends in the Y direction and is arranged in the X direction in the peripheral region PF1. In the example shown in FIG. 5, a width W1 (length in the X direction intersecting the extending direction) of each of the plurality of connection wirings WR1 is, for example, about 3 µm. Further, a separation distance P1 between the adjacent connection wirings WR1 is three times or more the width W1.

As shown in FIG. 6, each of the plurality of connection wirings WR1 is formed on an inorganic insulating film 31. The inorganic insulating film 31 is the same insulating film as any one or more of the insulating films 11, 12, 13, and 14 described with reference to FIG. 4. The inorganic insulating film 31 is formed in the same layer as one or more of the insulating films 11, 12, 13, and 14. The inorganic insulating film 31 extends to the display region DA shown in FIG. 1 and constitutes one or more insulating films of the insulating films 11, 12, 13 and 14 shown in FIG. 4 in the display region DA. In addition, the connection wiring WR1 is formed in the same layer as the source electrode SE, the drain electrode DE, or the wiring WR2 shown in FIG. 4. The connection wiring WR1 is formed by patterning a metal film formed on the inorganic insulating film 31 by, for example, the sputtering method. It is preferable that the connection wiring WR1 is formed on the inorganic insulating film 31 rather than being formed directly on the substrate 10 which is an organic insulating film. For example, since the substrate 10 is formed of an organic material, it has a large linear expansion coefficient and is easily shrunk. Therefore, when the connection wiring WR1 is directly formed on the substrate 10, the connection wiring WR1 and the substrate 10 may be delaminated at the interface therebetween in some cases.

On the other hand, in the case where the inorganic insulating film 31 having a smaller linear expansion coefficient than the substrate 10 is interposed between the connection wiring WR1 and the substrate 10 as in the present embodiment, shrinkage of the substrate 10 can be suppressed by the inorganic insulating film 31. Further, for example, the inorganic insulating film 31 can suppress moisture intrusion as compared with the substrate 10 made of an organic material. Therefore, in the case where the inorganic insulating film 31 is interposed between the connection wiring WR1 and the substrate 10, it is possible to suppress moisture from entering the connection wiring WR1. Note that the insulating film between the connection wiring WR1 and the substrate 10 may be an organic insulating film as long as it can suppress gas and moisture intrusion. Types of the organic insulating film include acrylic resin, epoxy resin, polyimide resin, and urethane resin.

In addition, the inorganic insulating film 31 and the connection wiring WR1 are covered with the organic insulating film 32. The organic insulating film 32 is the same insulating film as the flattening film 15 described with reference to FIG. 4. The organic insulating film 32 is formed in the same layer as the flattening film 15. The organic insulating film 32 extends to the display region DA shown in FIG. 1, and constitutes the flattening film 15 shown in FIG. 4 in the display region DA. The organic insulating film 32 functions as a protective film that suppresses oxidation and corrosion of the connection wiring WR1.

Meanwhile, as a configuration in which the inorganic insulating film 31 is disposed between the substrate 10 and the connection wiring WR1 and the connection wiring WR1 is covered with the organic insulating film 32, a configuration such as a display device DSP2 shown in FIG. 7 or a display device DSP3 shown in FIG. 8 can be considered in addition to the display device DSP1 shown in FIG. 6. For example, the display device DSP2 shown in FIG. 7 is different from the display device DSP1 shown in FIG. 6 in that the inorganic insulating film 31 is formed over the entire surface of the front surface 10f of the substrate 10.

When the entire surface of the front surface 10f of the substrate 10 is covered with the inorganic insulating film 31 as in the display device DSP2, damage such as cracks is likely to occur in the inorganic insulating film 31. The inorganic insulating film 31 has higher rigidity than the substrate 10. For this reason, when the large-area inorganic insulating film 31 is disposed on the substrate 10 in the curved peripheral region PF1 as shown in FIG. 2, the stress concentrates on a part of the inorganic insulating film 31 and cracks are likely to occur. In addition, when cracks occur in a part of the inorganic insulating film 31, the cracks develop in some cases. In particular, the peripheral region PF1 in which the terminal group is formed sometimes has a curved surface. In this case, damage such as cracks is particularly likely to occur. For example, when the crack generated in the peripheral region PF1 shown in FIG. 1 has developed into the display region DA, this may cause the deterioration of the reliability of the display device DSP2.

In order to suppress the cracks in the inorganic insulating film 31, it is preferable to reduce the stress applied to the inorganic insulating film 31 by reducing the area of the inorganic insulating film 31. For example, a structure of the display device DSP3 shown in FIG. 8 is conceivable. In the case of the display device DSP3, the inorganic insulating film 31 and the organic insulating film 32 are partially removed in a region where the connection wiring WR1 is not formed. In other words, in the case of the display device DSP3, the front surface 10f of the substrate 10 is exposed from the inorganic insulating film 31 and the organic insulating film 32. In the case of the display device DSP3, the inorganic insulating film 31 is patterned, so that a region RS2 where the inorganic insulating film 31 is not formed is provided between the adjacent connection wirings WR1. With such a structure, since stress applied to the inorganic insulating film 31 can be reduced, cracks of the inorganic insulating film 31 can be suppressed. The structure shown in FIG. 8 can be obtained by stacking the inorganic insulating film 31, the plurality of connection wirings WR1, and the organic insulating film 32 as in the display device DSP2 shown in FIG. 7 and then removing the inorganic insulating film 31 and the organic insulating film 32 in the region RS2 shown in FIG. 8 by etching or the like.

However, according to the study by the inventor of the present application, it was found that a new problem that does not occur in the structure of the display device DSP2 arises in the case of the display device DSP3. Namely, in the case of the display device DSP3, a height difference GP2 between the region RS2 where the front surface 10f of the substrate 10 is exposed and a region RS1 overlapping the connection wiring WR1 becomes larger. In the case of the example shown in FIGS. 6 to 8, a thickness of the inorganic insulating film 31 is about 0.6 μm, a thickness of the connection wiring WR1 is about 0.4 μm, and a thickness of the organic insulating film 32 (for example, a distance from the substrate 10 to the front surface 32f of the organic insulating film 32 in the region RS2 in FIG. 6) is about 2 μm. Therefore, the height difference GP2 between the front surface 32f of the organic insulating film 32 and the front surface 10f of the substrate 10 is about 3 μm. Since the thickness of the substrate 10 is, for example, about 10 μm, the height difference GP2 is one-fourth or more of the thickness of the substrate 10. In addition, the thickness of the organic insulating film 32 in the region RS2 in FIG. 6 is three times or less (about twice in the example described above) of the total value of the thickness of the inorganic insulating film 31 and the thickness of the connection wiring WR1 in the region RS1.

Figure 9:
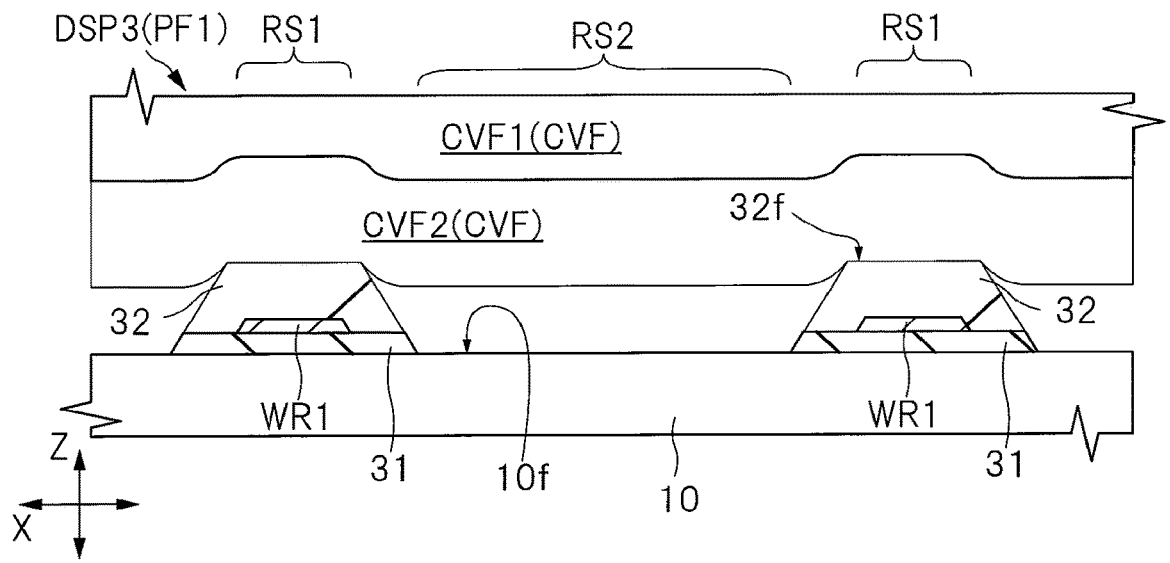
FIG. 9 is an enlarged cross-sectional view showing a state where a cover film is stuck to the peripheral region of the display device shown in FIG. 8.
Figure 10:
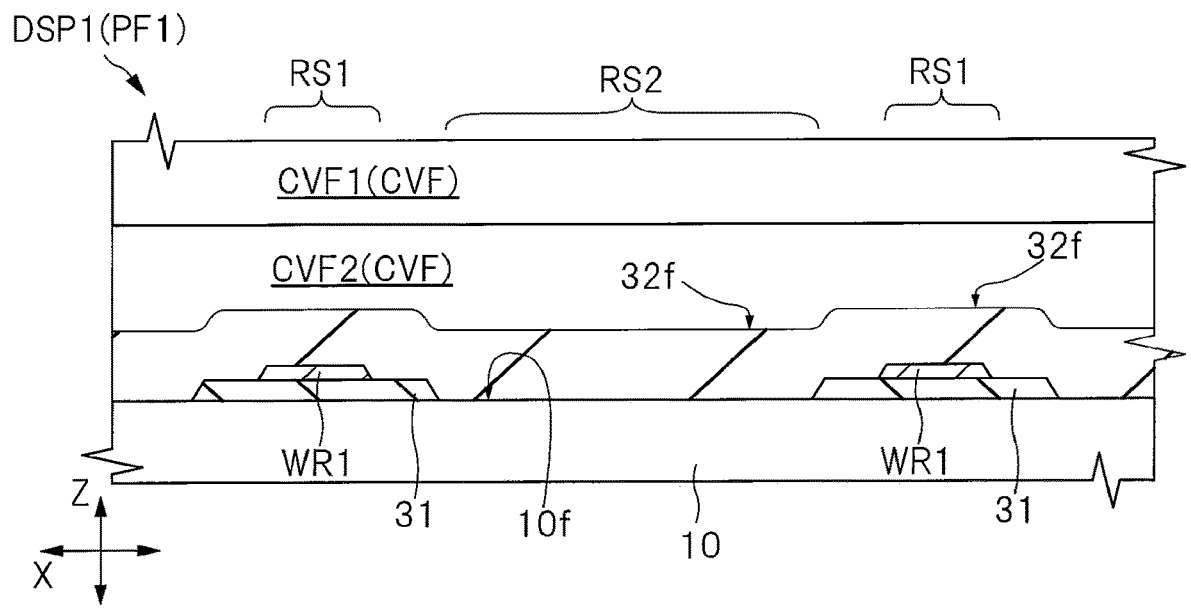
FIG. 10 is an enlarged cross-sectional view showing a state where a cover film is stuck to the peripheral region of the display device shown in FIG. 6.

When there is large unevenness in the peripheral region PF1 as in the display device DSP3 shown in FIG. 8, for example, the problems as follows arise. That is, in the manufacturing process of the display devices DSP1, DSP2, and DSP3, after forming the respective members on the substrate 10, a cover film CVF shown in FIGS. 9 and 10 is stuck in some cases in order to protect the members formed on the substrate 10. FIG. 9 is an enlarged cross-sectional view showing a state where a cover film is stuck to the peripheral region of the display device shown in FIG. 8. FIG. 10 is an enlarged cross-sectional view showing a state where a cover film is stuck to the peripheral region of the display device shown in FIG. 6.

For example, when the manufacturing process of the display device includes an assembly process and a substrate cutting process, a transport process for transporting the substrate before cutting is provided between the assembly process and the substrate cutting process. In this transport process, in order to protect assembled members from contamination by foreign matters and damage, it is preferable to stick the cover film CVF above the front surface 10f of the substrate 10 as shown in FIGS. 9 and 10. The cover film CVF functions as a protective film.

The cover film CVF is a resin film having a base layer CVF1 and an adhesive layer CVF2 provided on at least one surface of the base layer CVF1. In order to avoid the residue of the adhesive layer CVF2 remaining on the final product, a material having good releasability from the organic insulating film 32 shown in FIG. 6 is used for the adhesive layer CVF2. Here, in the case of the display device DSP3 shown in FIG. 9, the height difference GP2 (see FIG. 8) between the front surface 32f of the organic insulating film 32 and the front surface 10f of the substrate 10 is large and the area of the peripheral region PF1 where the terminal group is formed is small. Thus, the front surface 10f of the substrate 10 and the adhesive layer CVF2 of the cover film CVF are less likely to come into contact with each other in the region RS2. For example, there is a high possibility that the cover film CVF is adhered only to the front surface 32f of the organic insulating film 32. In this case, the adhesion area between the cover film CVF and the organic insulating film 32 is small, and it may cause the cover film CVF to delaminate. When the cover film CVF delaminates in the peripheral region PF1, the members on the substrate 10 may not be sufficiently protected in some cases. Further, when the cover film CVF delaminates to be misaligned, defects in the manufacturing process are caused. Specifically, a portion not covered with the cover film CVF is damaged during the manufacturing process, and a portion to be exposed from the cover film CVF such as an alignment mark is covered.

As shown in FIG. 6, the peripheral region PF1 of the display device DSP1 of the present embodiment has a region (first region) RS1 overlapping the connection wiring WR1 and a region (second region) RS2 not overlapping the connection wiring WR1. The region RS1 and the region RS2 are arranged in the X direction. Also, the inorganic insulating film 31 and the organic insulating film 32 are preset in the region RS1, and the inorganic insulating film 31 is not present and the organic insulating film 32 is present in the region RS2. In other words, in the display device DSP1, the inorganic insulating film 31 is removed in the region RS2, but the organic insulating film 32 is not removed. In the case of forming such a structure, a part of the inorganic insulating film 31 is removed by etching or the like after forming the inorganic insulating film 31 (or after forming the connection wiring WR1) and before forming the organic insulating film 32. Thereafter, the organic insulating film 32 is formed to obtain the above-described structure. In general, the organic insulating film 32 has a function of flattening the surface, but it is also possible to form a slight dent as shown in FIG. 6 if the material of the organic insulating film is not excessive. Also, it is possible to form a dent by partially adjusting the exposure amount of the organic insulating film 32.

In FIGS. 5 and 6, only the region overlapping the connection wiring WR1 is defined as the region RS1, and the region between the adjacent regions RS1 and not overlapping the inorganic insulating film 31 is defined as the region RS2. In the case of the display device DSP1, since the region where the inorganic insulating film 31 is formed is larger than the region where the connection wiring WR1 is formed in plan view, a region that overlaps the inorganic insulating film 31 and does not overlap the connection wiring WR1 is present between the region RS1 and the region RS2. However, as a modification, the region RS1 and the region RS2 may be adjacent to each other. Alternatively, the definitions of the regions RS1 and RS2 may be made on the basis of the inorganic insulating film 31. Namely, the region overlapping the inorganic insulating film 31 may be defined as the region RS1, and the region not overlapping the inorganic insulating film 31 may be defined as the region RS2. In this case, the region RS1 and the region RS2 are adjacent to each other. The definitions of the region RS1 and the region RS2 are the same for various modifications described below.

In the case of the display device DSP1, since the region RS2 without the inorganic insulating film 31 is present between the adjacent regions RS1, the area of the inorganic insulating film 31 in the peripheral region PF1 can be reduced. As a result, it is possible to reduce the cracks in the inorganic insulating film 31. The organic insulating film 32 in the region RS1 is softer than the inorganic insulating film 31 and has lower rigidity. Therefore, as shown in FIG. 6, even if the organic insulating film 32 is arranged so as to cover the plurality of connection wirings WR1, cracks do not occur in the organic insulating film 32. Further, since no cracks occur in the organic insulating film 32, even if the organic insulating film 32 is continuous from the peripheral region PF1 to the display region DA shown in FIG. 1, development of cracks does not occur.

Further, in the case of the display device DSP1, the organic insulating film 32 is present in the region RS2, and the front surface 10f of the substrate 10 is not exposed. In this case, as compared with the display device DSP3 shown in FIG. 8, the height difference GP1 (see FIG. 6) between the front surface 32f of the organic insulating film 32 in the region RS2 and the front surface 32f of the organic insulating film 32 in the region RS1 can be reduced. Therefore, as shown in FIG. 10, when the cover film CVF is stuck to the peripheral region PF1 of the display device DSP1, the adhesive layer CVF2 of the cover film CVF easily adheres to both the region RS1 and the region RS2. Namely, in the case of the display device DSP1 shown in FIG. 10, it is easier to suppress delamination of the cover film CVF as compared with the display device DSP3 shown in FIG. 9.

In the case of the display device DSP1 shown in FIG. 6, stepped portions are formed on the front surface 32f of the organic insulating film 32 following the shape of the members present on the substrate 10. In other words, the value of the height difference GP1 between the front surface 32f of the organic insulating film 32 in the region RS2 and the front surface 32f of the organic insulating film 32 in the region RS1 is not zero. Considering the easiness of adhesion of the cover film CVF shown in FIG. 10, it is preferable that the value of the height difference GP1 is small. The value of the height difference GP1 is preferably one-fourth or less of the thickness of the substrate 10. In addition, the distance from the front surface 10f of the substrate 10 to the front surface 32f of the organic insulating film 32 in the region RS2 is preferably one-third or more of the distance from the front surface 10f to the front surface 32f of the organic insulating film 32 in the region RS1. Further, when the film thickness of the organic insulating film 32 is reduced, the stepped portions shown in FIG. 6 are formed. The distance from the front surface 10f of the substrate 10 to the front surface 32f of the organic insulating film 32 in the region RS2 is two-thirds or less of the distance from the front surface 10f to the front surface 32f of the organic insulating film 32 in the region RS1.

In the case of the structure shown in FIG. 6, the value of the height difference GP1 is equal to or less than the total value of the thicknesses of the members other than the organic insulating film 32 arranged in the region RS. In the example shown in FIG. 6, the thickness of the inorganic insulating film 31 is about 0.6 μm, and the thickness of the connection wiring WR1 is about 0.4 μm. In this case, the value of the height difference GP1 is 1.0 μm or less. In addition, as the thickness of the organic insulating film 32 is increased, the front surface 32f tends to be flattened. For example, in the example shown in FIG. 6, the thickness of the organic insulating film 32 is about 2 μm, and the value of the height difference GP1 is smaller than the thickness of the inorganic insulating film 31 and is 0.6 μm or less. Further, by further increasing the thickness of the organic insulating film 32, the value of the height difference GP1 can be made zero, for example.

Figure 11:
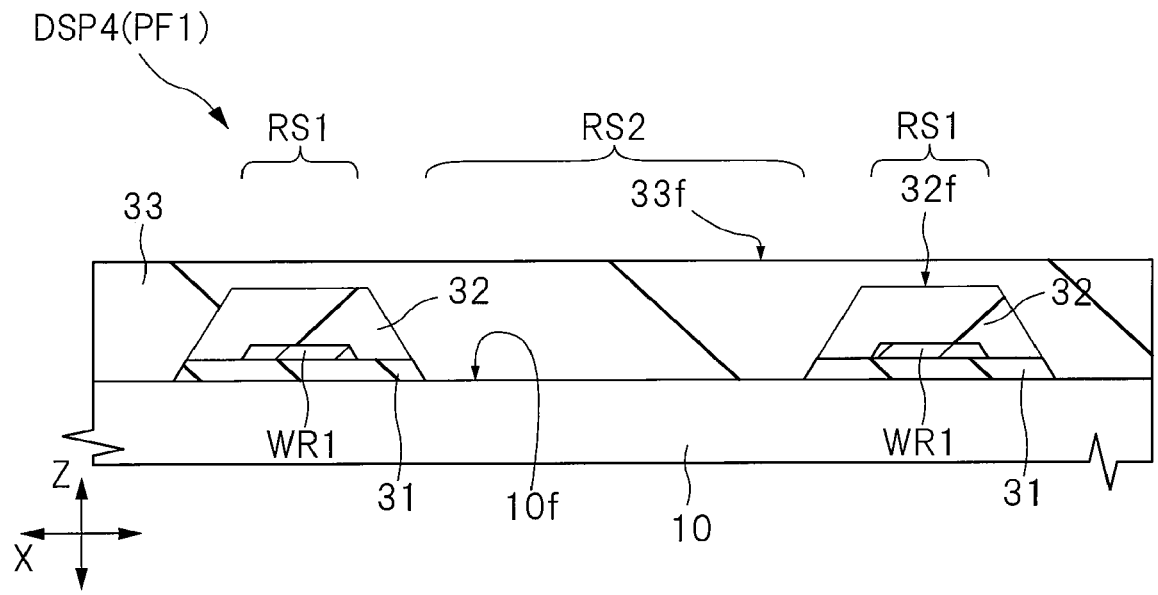
FIG. 11 is an enlarged cross-sectional view of a peripheral region of a display device which is a modification with respect to FIG. 1.

Further, as in a display device DSP4 shown in FIG. 11, the organic insulating film 32 may be patterned and another organic insulating film 33 may be disposed between the adjacent organic insulating films 32. FIG. 11 is an enlarged cross-sectional view of a peripheral region of a display device which is a modification with respect to FIG. 1. The display device DSP4 is different from the display device DSP1 shown in FIG. 6 in that the organic insulating film 32 present in the region RS1 is not provided in the region RS2 and the organic insulating film 33 different from the organic insulating film 32 is provided therein. The organic insulating film 33 is made of a resin having step coverage characteristics higher than those of the organic insulating film 32, for example, a material whose viscosity of a raw material resin before curing is lower than that of a raw material resin of the organic insulating film 32. Thus, the organic insulating film 33 is buried between the adjacent organic insulating films 32. In addition, in the example shown in FIG. 11, the front surface 32f of the organic insulating film 32 is covered with the organic insulating film 33. In other words, in the case of the display device DSP4, the organic insulating film in the peripheral region includes the organic insulating film (first organic insulating film) 32 in the region RS1 and the organic insulating film (second organic insulating film) 33 in the region RS2. The organic insulating film 32 is not present in the region RS2, and the organic insulating film 32 is covered with the organic insulating film 33 in the region RS1. Since the organic insulating film 33 is made of a resin having high step coverage characteristics as described above, a front surface 33f of the organic insulating film 33 can be a flat surface with high flatness.

In the case where the organic insulating film 32 is covered with the organic insulating film 33 having the flat front surface 33f as in the display device DSP4, since there is no region where the barrier property against moisture or the like decreases, reliability of the connection wiring can be improved. In the case of the display device DSP4, the organic insulating film 33 is formed after collectively patterning the organic insulating film and the inorganic insulating film 31. In this case, as compared with the manufacturing process of the display device DSP1 shown in FIG. 6, a step of forming the organic insulating film 33 is added in the manufacturing process of the display device DSP4. Therefore, from the viewpoint of reducing the number of manufacturing steps, the display device DSP1 shown in FIG. 6 is more preferable.

Figure 12:
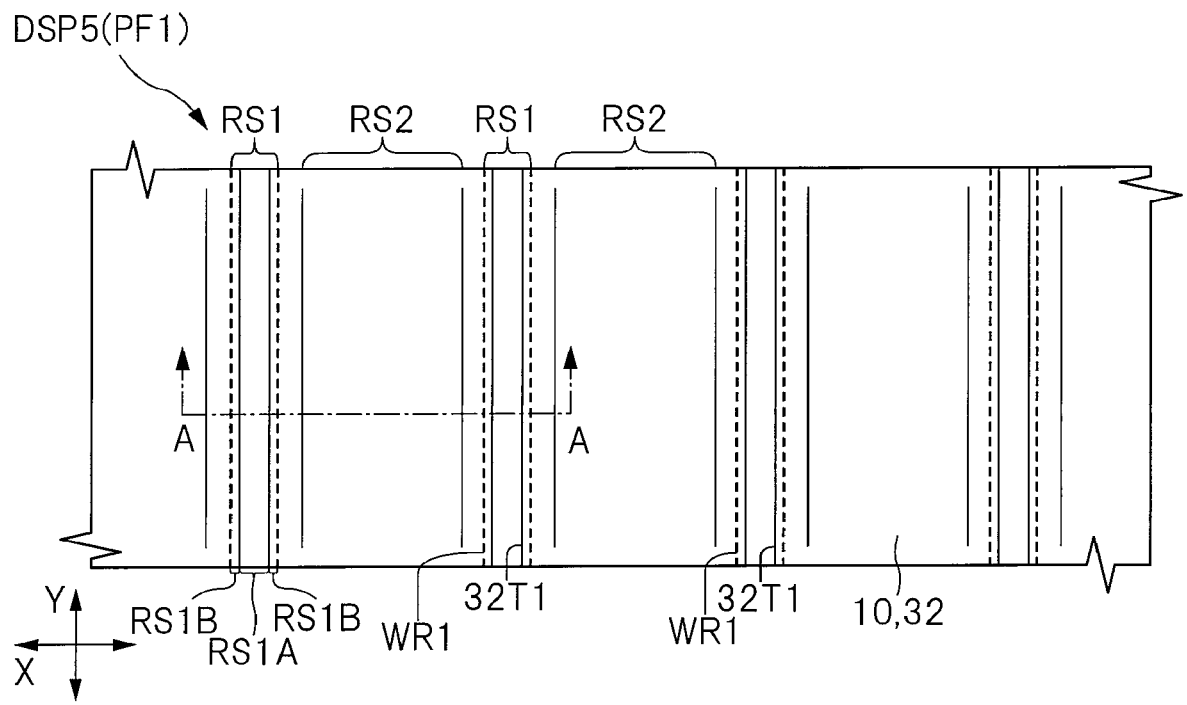
FIG. 12 is an enlarged plan view showing a modification with respect to FIG. 5.
Figure 13:
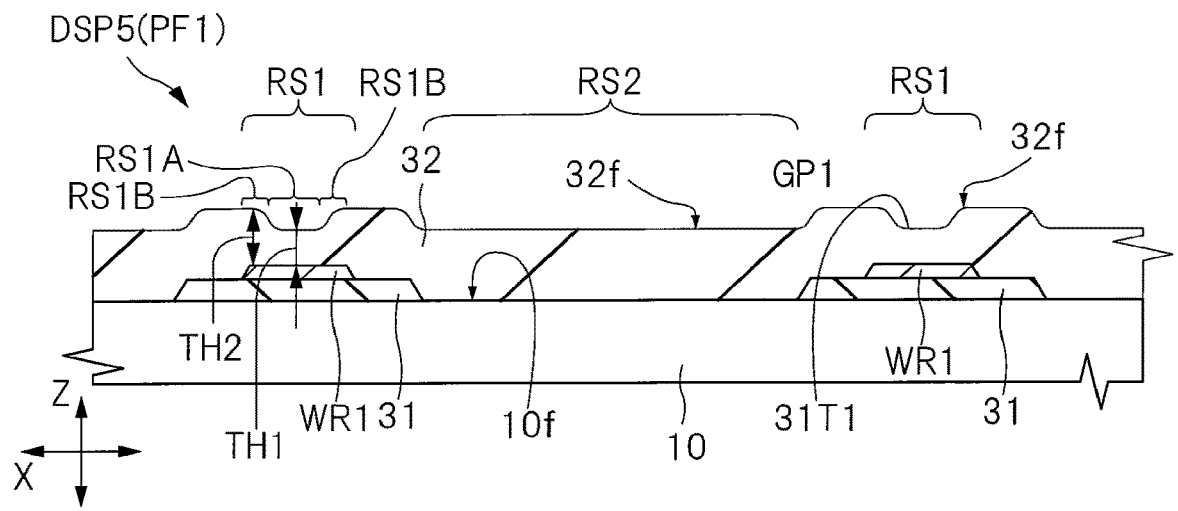
FIG. 13 is an enlarged cross-sectional view taken along a line A-A of FIG. 12.

Further, as in a display device DSP5 shown in FIGS. 12 and 13, the bonding area with the cover film CVF (see FIG. 10) may be increased by providing unevenness on the front surface 32f of the organic insulating film 32 in the region RS1. FIG. 12 is an enlarged plan view showing a modification with respect to FIG. 5. FIG. 13 is an enlarged cross-sectional view taken along a line A-A of FIG. 12.

The display device DSP5 is different from the display device DSP1 shown in FIGS. 5 and 6 in that the organic insulating film 32 has trenches (dents) 32T1 extending in the Y direction in the region RS1. The structure of the display device DSP5 can also be expressed as follows. That is, the region RS1 has a region (first A region) RS1A and a region (first B region) RS1B. As shown in FIG. 13, the thickness TH1 of the organic insulating film 32 in the region RS1A is smaller than the thickness TH2 of the organic insulating film 32 in the region RS1B. Each of the regions RS1A and the region RS1B extends in the Y direction shown in FIG. 12.

The trench 32T1 of the display device DSP5 is formed by, for example, forming the organic insulating film 32 covering the inorganic insulating film 31 and the connection wiring WR1, and then removing a part of the organic insulating film 32 in the region RS1 by etching. The depth of the trench 32T1 formed intentionally in this manner can be easily controlled.

By providing the region RS1A in which the thickness of the organic insulating film 32 is small in the region RS1 as in the display device DSP5, the rigidity of the region RS1 is lowered, so that the region RS1 can be curved more easily. In addition, the surface area of the front surface 32f of the organic insulating film 32 in the region RS1 increases. Therefore, it is possible to increase the bonding area between the cover film CVF (see FIG. 10) and the organic insulating film 32 in the region RS1. For example, even if the organic insulating film 32 and the cover film CVF (see FIG. 9) are not bonded in the region RS2 of the display device DSP5, delamination of the cover film CVF can be suppressed as compared with the display device DSP3 shown in FIG. 9.

Further, the display device DSP5 has a plurality of regions RS1B in one region RS1, and the region RS1A is sandwiched between the plurality of regions RS1B. In other words, the organic insulating film 32 has protrusions on both sides of the trench 32T1. In the case where the protrusions are arranged on both sides of the trench 32T1 as in the display device DSP5, the surface area of the front face 32f in the region RS1 can be further increased as compared with the case where one protrusion is provided in one region RS1.

Figure 14:
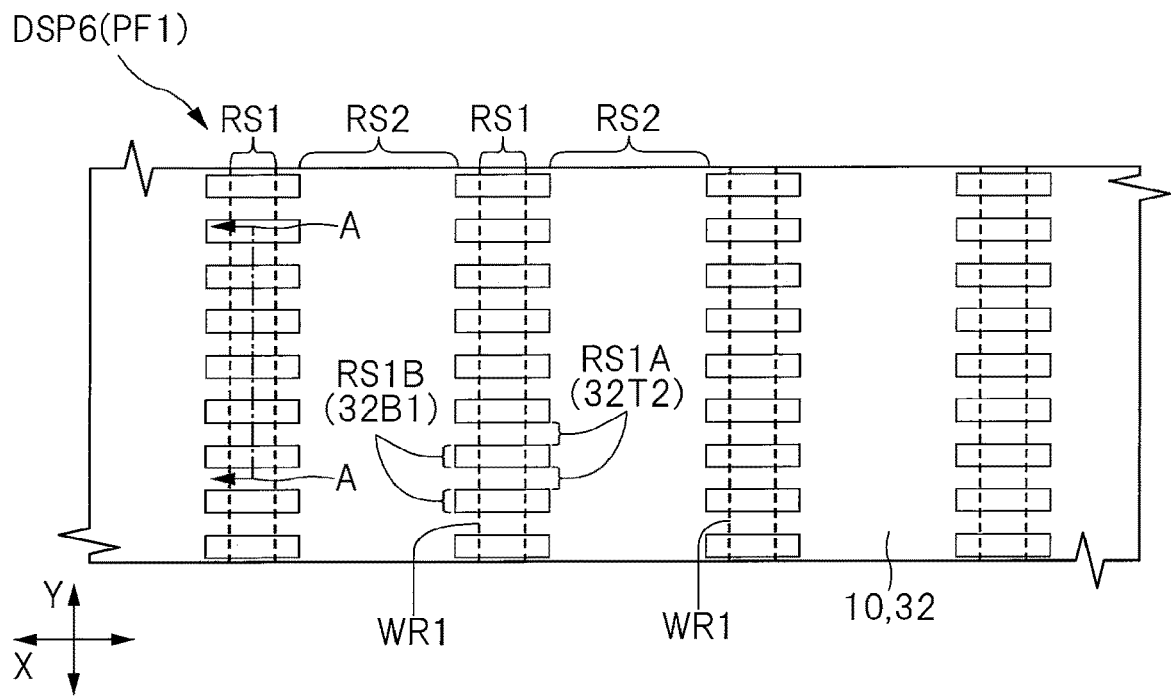
FIG. 14 is an enlarged plan view of a peripheral region of a display device which is a modification with respect to FIG. 12.
Figure 15:
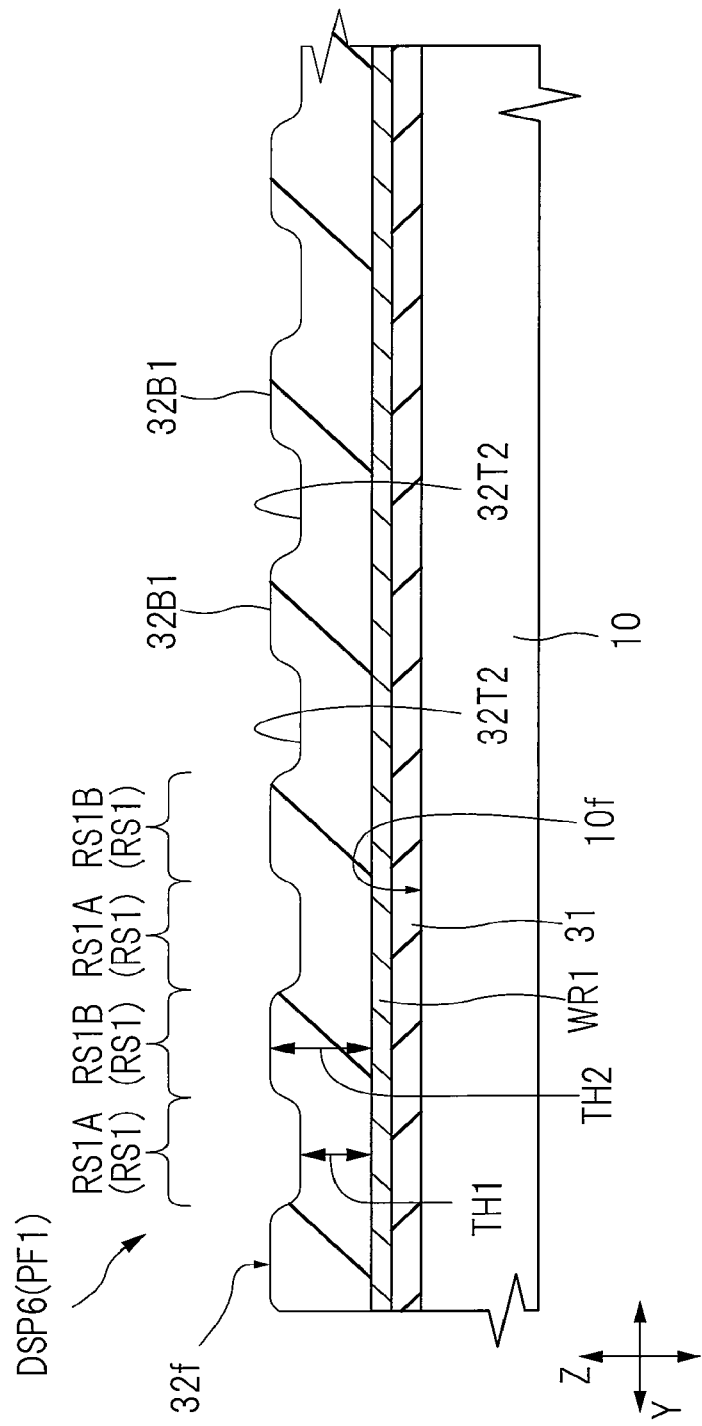
FIG. 15 is an enlarged cross-sectional view taken along a line A-A of FIG. 14.

In the case of the display device DSP5, each of the region RS1A and the region RS1B shown in FIG. 13 extends in the extending direction of the connection wiring WR1 (in the case of the display device DSP5, the Y direction shown in FIG. 12). However, when the trench is formed by removing a part of the organic insulating film by a method such as etching as described above, there are various modifications in the extending direction of the trench and the layout. For example, as in a display device DSP6 shown in FIGS. 14 and 15, a plurality of trenches 32T2 and a plurality of protrusions 32B1 may be arranged alternately in the extending direction of the connection wiring WR1. FIG. 14 is an enlarged plan view of a peripheral region of a display device which is a modification with respect to FIG. 12. FIG. 15 is an enlarged cross-sectional view taken along a line A-A of FIG. 14.

In the case of the display device DSP6, the plurality of regions RS1A and the plurality of regions RS1B are alternately arranged in the extending directions (Y direction shown in FIGS. 14 and 15) of the plurality of connection wirings WR1. In other words, on the organic insulating film 32 of the display device DSP6, the plurality of trenches 32T2 and the plurality of protrusions 32B1 are alternately arranged in the extending direction of the connection wiring WR1. Also in the case of the display device DSP6, the surface area of the front surface 32f of the organic insulating film 32 in the region RS1 can be increased as compared with the display device DSP3 shown in FIG. 8.

In the case of the display device DSP6, as shown in FIG. 14, the plurality of regions RS1A extend in a direction (X direction in FIG. 14) intersecting the extending direction (Y direction in FIG. 14) of each of the plurality of connection wirings WR1 and are continuous with the region RS2. In other words, the plurality of trenches 32T2 extend in a direction (X direction in FIG. 14) intersecting the extending direction (Y direction in FIG. 14) of each of the plurality of connection wirings WR1 and are continuous with the region RS2. When the cover film CVF shown in FIG. 10 is stuck to the peripheral region PF1 of the display device DSP6, since the trench 32T2 is continuous with the region RS2, air is less likely to stay in the trench 32T2. Therefore, the adhesive layer CVF2 (see FIG. 10) of the cover film CVF can be easily adhered to the inner surface of the trench 32T2.

Figure 16:
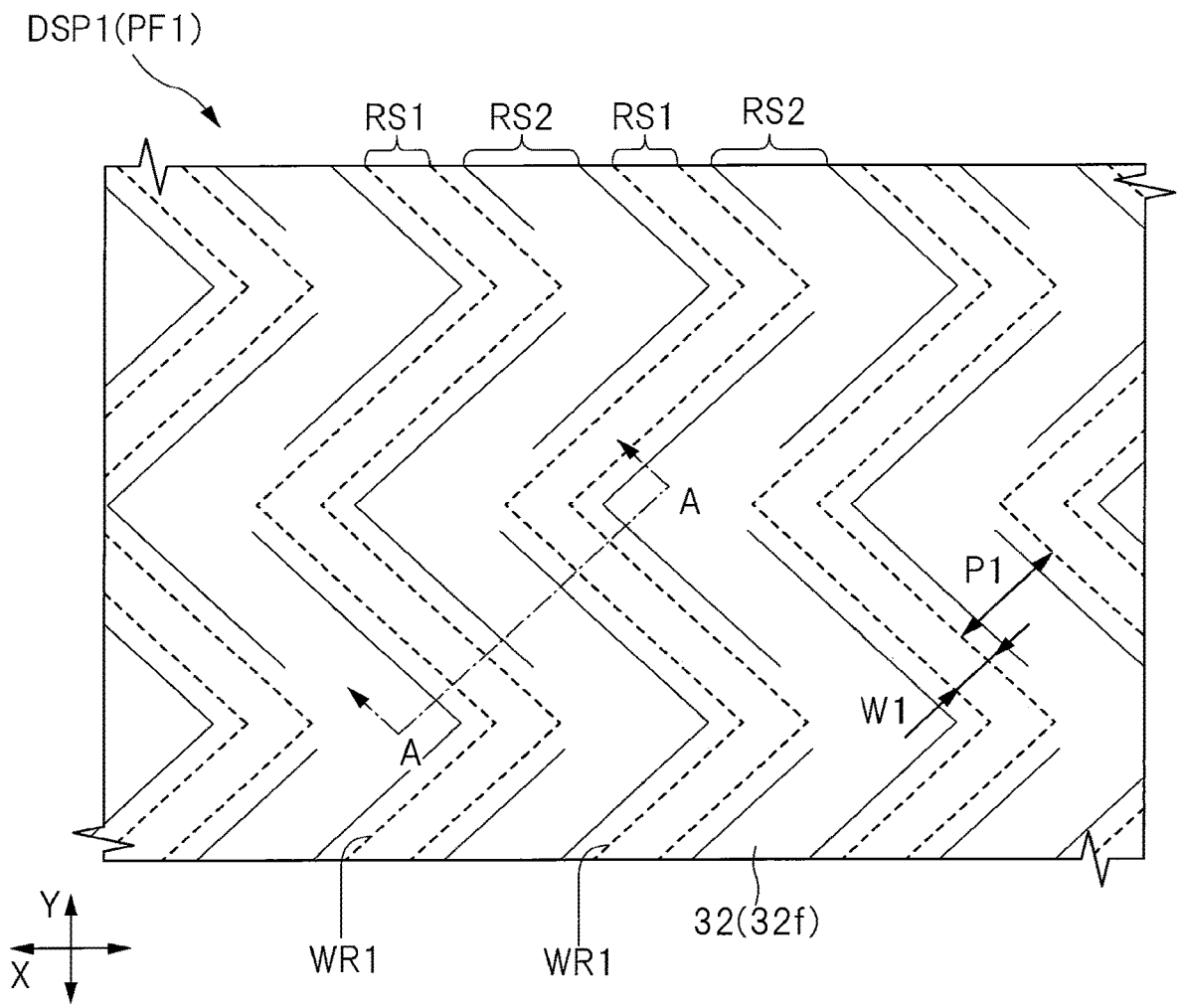
FIG. 16 is an enlarged plan view of a peripheral region of a display device which is another modification with respect to FIG. 5.
Figure 17:
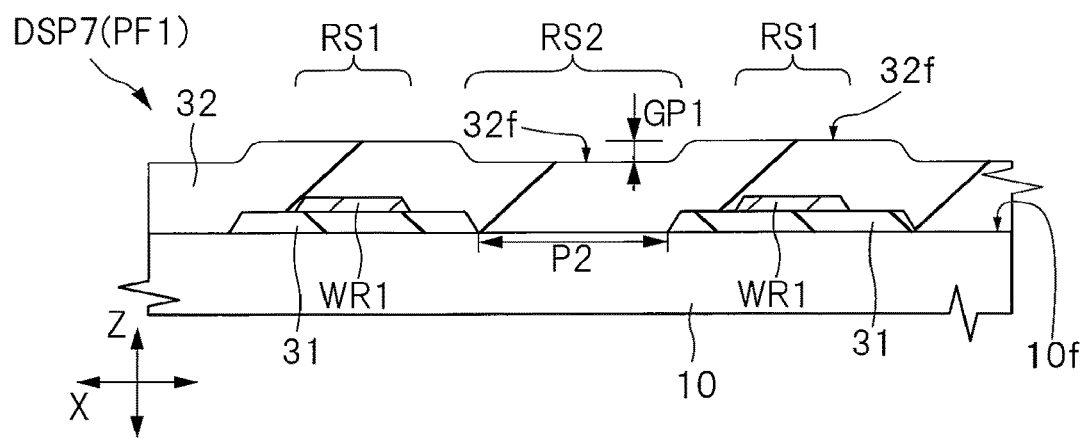
FIG. 17 is an enlarged cross-sectional view taken along a line A-A of FIG. 16.

In the display device DSP1 shown in FIG. 5, the display device DSPS shown in FIG. 12, or the display device DSP6 shown in FIG. 14, the embodiment in which the connection wiring WR1 linearly extends in the Y direction has been described. However, there are various modifications in the extending direction of the connection wiring WR1. As a modification of the connection wiring WR1, a display device DSP7 shown in FIGS. 16 and 17 can be exemplified. FIG. 16 is an enlarged plan view of the peripheral region of the display device which is another modification with respect to FIG. 5. FIG. 17 is an enlarged cross-sectional view taken along a line A-A of FIG. 16.

The display device DSP7 shown in FIGS. 16 and 17 is different from the display device DSP1 shown in FIG. 5 in that each of the plurality of connection wirings WR1 extends in a zigzag manner in the Y direction. In other words, each of the plurality of connection wirings WR1 of the display device DSP7 extends so as to meander in the Y direction. In this case, the region RS1 which is a region overlapping the connection wiring WR1 extends in a zigzag manner (in other words, so as to meander) in the Y direction like the connection wiring WR1. Further, the plurality of connection wirings WR1 are arranged at regular intervals. The region RS2 which is located between the plurality of regions RS1 and does not overlap the connection wiring WR1 also extends in a zigzag manner (in other words, so as to meander) in the Y direction like the region RS1. In the case where the peripheral region PF1 is curved, the stress applied to the connection wiring WR1 decreases when the connection wiring WR1 meanders, and disconnection of the connection wiring WR1 can be suppressed.

In the case of the display device DSP7, since the region RS1 extends in a zigzag manner, the area of the front surface 32f of the organic insulating film 32 in the region RS1 is larger than that of the display device DSP1 shown in FIG. 5. Further, when the connection wiring WR1 meanders, the separation distance P1 between the adjacent connection wirings WR1 becomes narrower as compared with the example shown in FIG. 5 in order to dispose the same number of connection wirings WR1 as the display device DSP1. In the example shown in FIG. 16, the width W1 of each of the plurality of connection wirings WR1 is, for example, about 3 μm. Further, the separation distance P1 between the adjacent connection wirings WR1 is, for example, about 8.5 μm. As described above, when the plurality of connection wirings WR1 are arranged at a narrow pitch, the bonding area between the cover film CVF and the front surface 32f of the organic insulating film 32 shown in FIG. 10 can be increased.

Further, in the case of the display device DSP7, since the connection wiring WR1 extends in a zigzag manner, the inorganic insulating film 31 interposed between the connection wiring WR1 and the substrate 10 also extends in a zigzag manner (in other words, so as to meander) in the Y direction like the connection wiring WR1. Therefore, the surface area of the inorganic insulating film 31 is larger than the area of the inorganic insulating film 31 of the display device DSP1 shown in FIG. 6. In addition, since the value of the separation distance P1 shown in FIG. 16 is small, the value of the separation distance P2 between the adjacent inorganic insulating films 31 is also small as shown in FIG. 17. In the example shown in FIG. 17, the separation distance P2 is about 5 μm. In the case of the display device DSP7, since the area of the inorganic insulating film 31 is large, it is preferable that the inorganic insulating film 31 is reliably removed in the region RS2 from the viewpoint of suppressing cracks of the inorganic insulating film 31. If the inorganic insulating film 31 is removed in the region RS2, the shape of the inorganic insulating film 31 may be advantageous from the viewpoint of preventing cracks in some cases. Namely, when the inorganic insulating film 31 extends in a zigzag manner in the Y direction in the peripheral region PF1 in which the substrate 10 is curved, the stress generated due to the curvature of the substrate 10 is likely to be dispersed in various directions. Therefore, it is possible to suppress the stress concentration on a part of the inorganic insulating film 31, so that cracks of the inorganic insulating film 31 can be suppressed.

Figure 18:
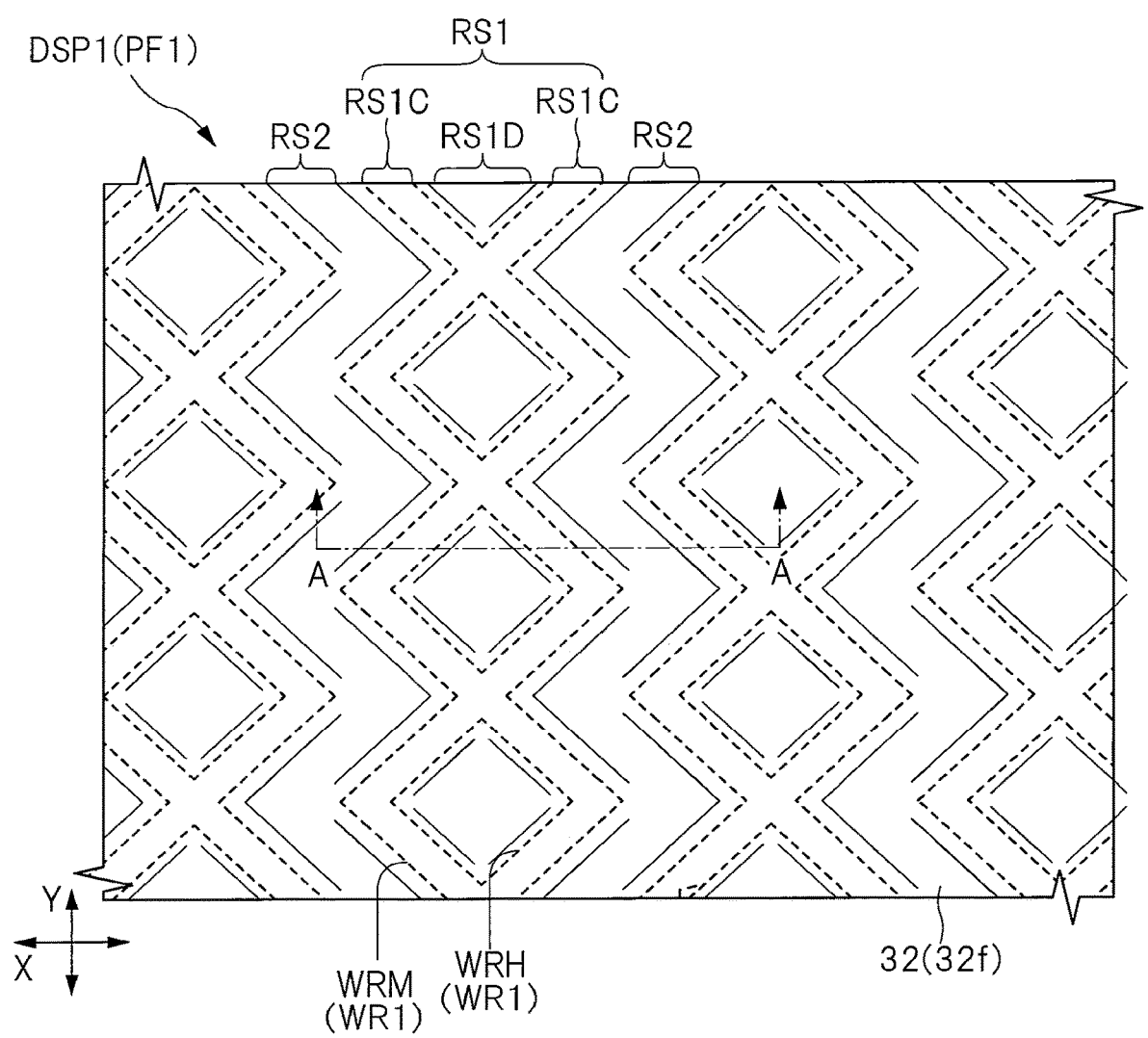
FIG. 18 is an enlarged plan view of a display device which is another modification with respect to FIG. 5.
Figure 19:
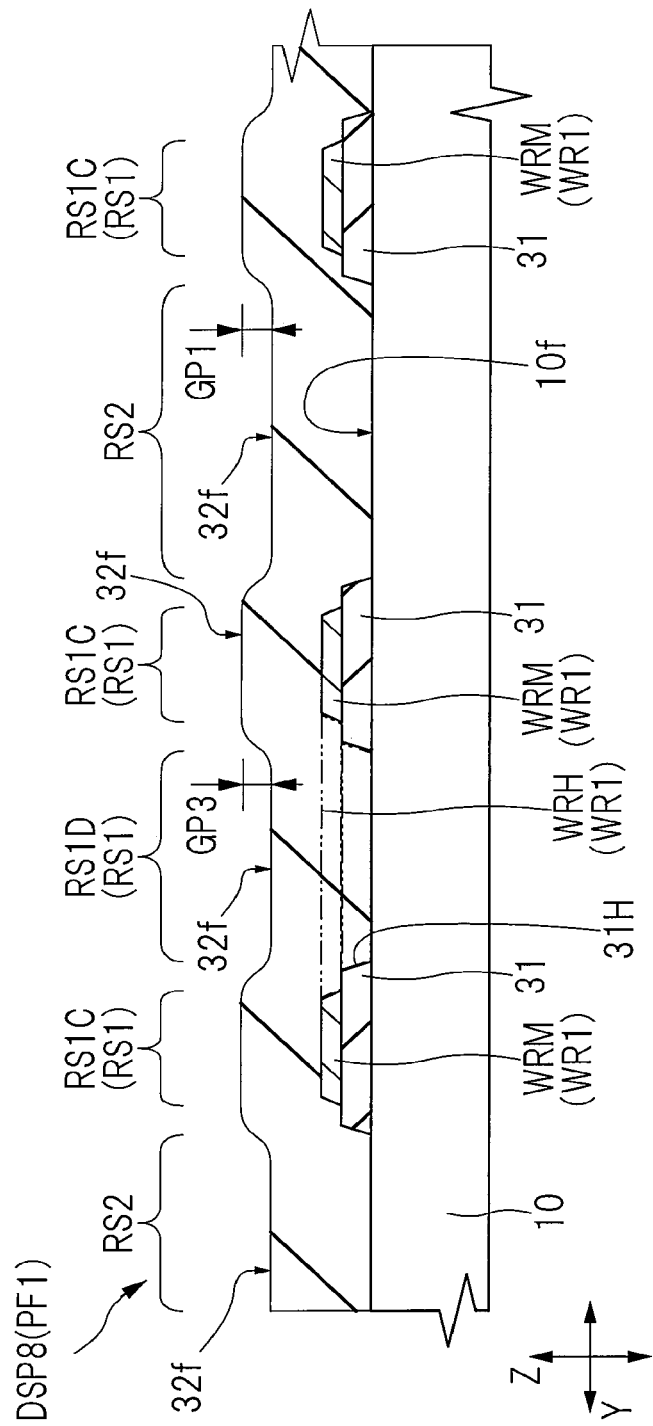
FIG. 19 is an enlarged cross-sectional view taken along a line A-A of FIG. 18.

As another modification relating to the structure of the connection wiring WR1, a display device DSP8 shown in FIGS. 18 and 19 can be exemplified. FIG. 18 is an enlarged plan view of a display device which is another modification with respect to FIG. 5. FIG. 19 is an enlarged cross-sectional view taken along a line A-A of FIG. 18. In FIG. 19, in order to clearly show a range of an opening WRH and an opening 31H, they are indicated by two-dot chain lines.

The display device DSP8 shown in FIGS. 18 and 19 is different from the display device DSP1 shown in FIG. 5 in that each of the plurality of connection wirings WR1 has a plurality of openings WRH. Specifically, each of the plurality of connection wirings WR1 of the display device DSP8 includes a plurality of openings WRH and a wiring portion WRM surrounding each of the plurality of openings WRH. Also, the region RS1 overlapping the connection wiring WR1 has a region RS1C and a region RS1D. As shown in FIG. 19, the region RS1C overlaps the wiring portion WRM and the inorganic insulating film 31. Further, the region RS1D overlaps the opening WRH and does not overlap the wiring portion WRM and the inorganic insulating film 31. In other words, the inorganic insulating film 31 is present between the wiring portion WRM of the connection wiring WR1 and the substrate 10, and the opening 31H (see FIG. 19) having no inorganic insulating film 31 is present between the opening WRH of the connection wiring WR1 and the substrate 10.

In the expression above, the region RS1D overlapping the plurality of openings WRH provided in the connection wiring WR1 is regarded as a part of the region RS1, and the region RS2 present between the adjacent regions RS1 and not overlapping the inorganic insulating film 31 is distinguished from the region RS1D.

As shown in FIG. 19, in the case of the display device DSP8, the inorganic insulating film 31 is not present in the region RS2 between the adjacent regions RS1. In addition, in the case of the display device DSP8, by providing the plurality of openings 31H in the inorganic insulating film 31 in the peripheral region PF1 where the substrate 10 is curved, the stress applied to the patterned inorganic insulating film 31 is dispersed. Therefore, it is possible to suppress cracks of the inorganic insulating film 31 even when a bending stress is applied to the peripheral region PF1.

In addition, in the case of the display device DSP8, the inorganic insulating film 31 is not present in the region RS2 and the organic insulating film 32 is present therein as in the display device DSP1. Therefore, the height difference GP1 between the front surface 32f of the organic insulating film 32 in the region RS2 and the front surface 32f of the organic insulating film 32 in the region RS1 can be reduced. Therefore, when sticking the cover film CVF shown in FIG. 10 to the peripheral region PF1 of the display device DSP8, it is possible to increase the bonding area between the cover film CVF and the organic insulating film 32. In addition, in the example shown in FIG. 19, the inorganic insulating film 31 is not present in the region RS1D and the organic insulating film 32 is present therein. Therefore, the height difference GP3 between the front surface 32f of the organic insulating film 32 in the region RS2 and the front surface 32f of the organic insulating film 32 in the region RS1 can be reduced. Note that the height difference GP1 and the height difference GP3 are approximately the same.

Though not shown, as a modification with respect to the display device DSP8, a display device without the organic insulating film 32 in the region RS1D shown in FIG. 19 is also conceivable. When the opening area of the opening WRH of the connection wiring WR1 is large, since the area of each of the plurality of regions RS1D becomes large, it is preferable that the organic insulating film 32 is present in the region RS1D as in the display device DSP8. However, when the opening area of the opening WRH of the connection wiring WR1 is small, since the area of each of the plurality of regions RS1D also becomes small, even when the organic insulating film 32 and the cover film CVF (see FIG. 10) are not adhered in the region RS1D, delamination may not occur if adhered in other parts.

<Other Modifications>

The technique described above can be applied to still other modifications in addition to the various modifications described above. For example, an organic EL display device is taken as an example of the display device in which the plurality of connection wirings WR1 are formed in the peripheral region PF1 where the substrate 10 is curved, but the type of an electro-optical layer is not particularly limited as long as the display device has the plurality of connection wirings WR1 formed in the curved peripheral region PF1.

Further, some or all of the above-described various modifications may be combined with a part or all of other modifications. Also, in the case of the display device DSP3 described with reference to FIGS. 8 and 9, the cover film CVF is delaminated if doing nothing, but the delamination can be suppressed by combining with, for example, the modification described with reference to FIGS. 12 to 15 because the adhesion area between the organic insulating film 32 and the cover film CVF increases. Further, by forming the plurality of connection wirings WR1 of the display device DSP3 into the shape shown in FIG. 16 or FIG. 18, the delamination can be suppressed because the adhesion area between the organic insulating film 32 and the cover film CVF increases.

The display device having the structure in which the modification described with reference to FIGS. 12 to 15 is combined with the display device DSP3 can be expressed as follows.

A display device comprising:
a display region;
a peripheral region around the display region;
a substrate having flexibility;
a terminal group in the peripheral region;
a plurality of connection wirings connected to the terminal group, extending from the terminal group in a first direction and arranged in a second direction intersecting the first direction;
an inorganic insulating film in the peripheral region; and
an organic insulating film in the peripheral region,
wherein the peripheral region has a first peripheral region curved in a thickness direction of the substrate,
the first peripheral region includes a first region that overlaps the plurality of connection wirings and a second region that does not overlap the plurality of connection wirings,
the first region and the second region are arranged in the second direction,
the inorganic insulating film and the organic insulating film are present in the first region,
the inorganic insulating film is not present in the second region,
the first region includes a first A region and a first B region, and
a thickness of the organic insulating film in the first A region is smaller than a thickness of the organic insulating film in the first B region.

It is understood that a person skilled in the art can derive various kinds of modifications and corrections in the range of the idea of the present invention, and these modifications and corrections are encompassed within the scope of the present invention. For example, the embodiments obtained by addition or elimination of components or design change or the embodiments obtained by addition or reduction of process or condition change to the embodiments described above by a person skilled in the art are also included in the scope of the present invention as long as they include the gist of the present invention.

What is claimed is:

1. A display device comprising:
a display region;
a peripheral region around the display region;
a substrate having flexibility;
a terminal group in the peripheral region;
a plurality of connection wirings connected to the terminal group, extending from the terminal group in a first direction and arranged in a second direction intersecting the first direction;
an inorganic insulating film in the peripheral region; and
an organic insulating film in the peripheral region,
wherein the peripheral region has a first peripheral region curved in a thickness direction of the substrate,
the first peripheral region includes a first region that overlaps the plurality of connection wirings and a second region that does not overlap the plurality of connection wirings,
the first region and the second region are arranged in the second direction,
the inorganic insulating film and the organic insulating film are present in the first region, and
the inorganic insulating film is not present and the organic insulating film is present in the second region.

2. The display device according to claim 1,
wherein the organic insulating film is interposed between each of the plurality of connection wirings and the substrate.

3. The display device according to claim 2,
wherein the organic insulating film in the peripheral region includes a first organic insulating film in the first region and a second organic insulating film in the second region,
the first organic insulating film is not present in the second region, and
the first organic insulating film is covered with the second organic insulating film in the first region.

4. The display device according to claim 2,
wherein the first region includes a first A region and a first B region, and
a thickness of the organic insulating film in the first A region is smaller than a thickness of the organic insulating film in the first B region.

5. The display device according to claim 4,
wherein the first region includes a plurality of the first B regions, and
the first A region is sandwiched between the plurality of first B regions.

6. The display device according to claim 5,
wherein the first A region and the plurality of first B regions extend in an extending direction of each of the plurality of connection wirings.

7. The display device according to claim 5,
wherein the first region includes a plurality of the first A regions, and the plurality of first A regions and the plurality of first B regions are alternately arranged in an extending direction of each of the plurality of connection wirings.

8. The display device according to claim 7,
wherein the plurality of first A regions extend in a direction intersecting the extending direction of each of the plurality of connection wirings and are continuous with the second region.

9. The display device according to claim 2,
wherein each of the plurality of connection wirings includes a plurality of openings and a wiring portion surrounding each of the plurality of openings,
the first region includes a first C region and a first D region,
the first C region overlaps the wiring portion and the inorganic insulating film, and
the first D region overlaps the opening and does not overlap the wiring portion and the inorganic insulating film.

10. The display device according to claim 9,
wherein the organic insulating film is present in the first D region.

11. The display device according to claim 1,
wherein the organic insulating film in the peripheral region includes a first organic insulating film in the first region and a second organic insulating film in the second region,
the first organic insulating film is not present in the second region, and
the first organic insulating film is covered with the second organic insulating film in the first region.

12. The display device according to claim 1,
wherein the first region includes a first A region and a first B region, and
a thickness of the organic insulating film in the first A region is smaller than a thickness of the organic insulating film in the first B region.

13. The display device according to claim 12,
wherein the first region includes a plurality of the first B regions, and
the first A region is sandwiched between the plurality of first B regions.

14. The display device according to claim 13,
wherein the A first region and the plurality of first B regions extend in an extending direction of each of the plurality of connection wirings.

15. The display device according to claim 13,
wherein the first region includes a plurality of the first A regions, and
the plurality of first A regions and the plurality of first B regions are alternately arranged in an extending direction of each of the plurality of connection wirings.

16. The display device according to claim 15,
wherein the plurality of first A regions extend in a direction intersecting the extending direction of each of the plurality of connection wirings and are continuous with the second region.

17. The display device according to claim 1,
wherein each of the plurality of connection wirings includes a plurality of openings and a wiring portion surrounding each of the plurality of openings,
the first region includes a first C region and a first D region,
the first C region overlaps the wiring portion and the inorganic insulating film, and
the first D region overlaps the opening and does not overlap the wiring portion and the inorganic insulating film.

18. The display device according to claim 7,
wherein the organic insulating film is present in the first D region.

19. The display device according to claim 1,
wherein a separation distance between adjacent connection wirings of the plurality of connection wirings is three times or more a width of each of the plurality of connection wirings.

20. The display device according to claim 1,
wherein a thickness of the organic insulating film in the first region is three times or less of a total value of a thickness of the inorganic insulating film and a thickness of the connection wiring in the first region.

* * * * *